(12) United States Patent
Kwak et al.

(10) Patent No.: US 10,672,454 B2
(45) Date of Patent: Jun. 2, 2020

(54) NONVOLATILE MEMORY DEVICES AND MEMORY SYSTEMS

(71) Applicant: Samsung Electronics Co., Ltd., Suwon-si (KR)

(72) Inventors: Dong-Hun Kwak, Hwaseong-si (KR); Hee-Woong Kang, Suwon-si (KR); Jun-Ho Seo, Hwaseong-si (KR); Hee-Won Lee, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/675,331

(22) Filed: Nov. 6, 2019

(65) Prior Publication Data

US 2020/0075078 A1    Mar. 5, 2020

Related U.S. Application Data

(60) Continuation of application No. 16/183,315, filed on Nov. 7, 2018, which is a division of application No.
(Continued)

(30) Foreign Application Priority Data

Aug. 4, 2016    (KR) .................. 10-2016-0099219

(51) Int. Cl.
    *G11C 7/12*    (2006.01)
    *G11C 11/4074*    (2006.01)
    (Continued)

(52) U.S. Cl.
    CPC .......... *G11C 11/4074* (2013.01); *G11C 7/109* (2013.01); *G11C 7/12* (2013.01);
    (Continued)

(58) Field of Classification Search
    CPC .................. G11C 5/147; G11C 7/12
    (Continued)

(56) References Cited

U.S. PATENT DOCUMENTS

| 5,737,258 A | 4/1998 | Choi et al. |
| 6,175,522 B1* | 1/2001 | Fang .................. G11C 16/0483 |
| | | 365/185.17 |

(Continued)

FOREIGN PATENT DOCUMENTS

| CN | 101506896 A | 8/2009 |
| CN | 102449701 A | 5/2012 |
| CN | 103177764 A | 6/2013 |

*Primary Examiner* — Michael T Tran
(74) *Attorney, Agent, or Firm* — Muir Patent Law, PLLC

(57) ABSTRACT

A nonvolatile memory device includes a memory cell array, a voltage generator, a page buffer circuit, a row decoder and a control circuit. The memory cell array includes a plurality of mats corresponding to different bit-lines. The voltage generator generates word-line voltages applied to the memory cell array. The page buffer circuit is coupled to the memory cell array through bit-lines. The row decoder is coupled to the memory cell array through word-lines, and the row decoder transfers the word-line voltages to the memory cell array. The control circuit controls the voltage generator, the row decoder and the page buffer circuit based on a command and an address. The control circuit selects a voltage between different voltages to apply the selected different voltages to at least one of the word-lines or at least one of the bit-lines according to a number of mats of the plurality mats, which operate simultaneously.

25 Claims, 17 Drawing Sheets

Related U.S. Application Data

15/604,406, filed on May 24, 2017, now Pat. No. 10,153,029.

(51) Int. Cl.

| | | |
|---|---|---|
| *G11C 7/10* | (2006.01) | |
| *G11C 8/12* | (2006.01) | |
| *G11C 16/08* | (2006.01) | |
| *G11C 11/408* | (2006.01) | |
| *G11C 11/4097* | (2006.01) | |
| *G11C 11/56* | (2006.01) | |
| *G11C 16/04* | (2006.01) | |
| *G11C 16/06* | (2006.01) | |
| *G11C 16/10* | (2006.01) | |
| *G11C 16/30* | (2006.01) | |
| *G11C 16/34* | (2006.01) | |

(52) U.S. Cl.
CPC ............ *G11C 8/12* (2013.01); *G11C 11/4082* (2013.01); *G11C 11/4085* (2013.01); *G11C 11/4097* (2013.01); *G11C 11/5628* (2013.01); *G11C 16/0483* (2013.01); *G11C 16/06* (2013.01); *G11C 16/08* (2013.01); *G11C 16/10* (2013.01); *G11C 16/30* (2013.01); *G11C 16/3436* (2013.01); *G11C 2207/2209* (2013.01)

(58) Field of Classification Search
USPC ............................................ 365/189.09, 226
See application file for complete search history.

(56) References Cited

U.S. PATENT DOCUMENTS

| | | | |
|---|---|---|---|
| 6,282,121 B1 | 8/2001 | Cho et al. | |
| 7,570,523 B2 | 8/2009 | Scheuerlein et al. | |
| 7,675,783 B2 | 3/2010 | Park et al. | |
| 8,456,914 B2 | 6/2013 | Missiroli et al. | |
| 8,824,207 B2 | 9/2014 | Kim et al. | |
| 8,953,395 B2 | 2/2015 | Seningen et al. | |
| 8,976,595 B2 | 3/2015 | Jeong et al. | |
| 9,236,128 B1 | 1/2016 | Louie et al. | |
| 9,236,139 B1 | 1/2016 | Lai et al. | |
| 9,245,639 B1 | 1/2016 | Lee et al. | |
| 9,281,067 B1 | 3/2016 | Lee et al. | |
| 9,390,808 B1* | 7/2016 | Kato ................. G11C 16/3445 | |
| 9,721,653 B2 | 8/2017 | Yan et al. | |
| 10,157,653 B1* | 12/2018 | Li ........................ G11C 11/161 | |
| 2003/0035322 A1 | 2/2003 | Wong | |
| 2004/0264262 A1 | 12/2004 | Ishimoto et al. | |
| 2005/0144361 A1* | 6/2005 | Gonzalez ............ G06F 12/0246 711/103 | |
| 2007/0086243 A1 | 4/2007 | Jo | |
| 2008/0089129 A1 | 4/2008 | Lee | |
| 2008/0205163 A1 | 8/2008 | Park et al. | |
| 2009/0141545 A1* | 6/2009 | Norman ................... G11C 5/02 365/163 | |
| 2009/0168534 A1 | 7/2009 | Park et al. | |
| 2010/0042774 A1* | 2/2010 | Yang .................. G06F 12/0246 711/103 | |
| 2011/0026348 A1 | 2/2011 | Narui | |
| 2011/0209031 A1 | 8/2011 | Kim et al. | |
| 2012/0230116 A1 | 9/2012 | Goda et al. | |
| 2012/0250437 A1 | 10/2012 | Nagata | |
| 2012/0254680 A1 | 10/2012 | Oh et al. | |
| 2013/0128668 A1 | 5/2013 | Kim | |
| 2013/0163361 A1 | 6/2013 | Nomoto et al. | |
| 2013/0176790 A1* | 7/2013 | Nguyen .............. G11C 11/5628 365/185.19 | |
| 2013/0223158 A1 | 8/2013 | Seningen et al. | |
| 2013/0223170 A1 | 8/2013 | Kajigaya | |
| 2013/0238843 A1 | 9/2013 | Kim et al. | |
| 2013/0250654 A1 | 9/2013 | Sugimae et al. | |
| 2013/0308403 A1 | 11/2013 | Nakai et al. | |
| 2013/0329489 A1 | 12/2013 | Kim et al. | |
| 2014/0025866 A1 | 1/2014 | Kim et al. | |
| 2014/0050010 A1 | 2/2014 | Toda | |
| 2014/0056055 A1 | 2/2014 | Ikeda et al. | |
| 2014/0063952 A1* | 3/2014 | Hara .................. G11C 16/0483 365/185.11 | |
| 2014/0068161 A1 | 3/2014 | Yi et al. | |
| 2014/0078814 A1* | 3/2014 | Shimakawa ........ G11C 13/0007 365/148 | |
| 2014/0092680 A1 | 4/2014 | Lee et al. | |
| 2014/0160847 A1 | 6/2014 | Kwak | |
| 2014/0192594 A1 | 7/2014 | Lue | |
| 2014/0198581 A1 | 7/2014 | Kim et al. | |
| 2015/0037931 A1 | 2/2015 | Kuniya | |
| 2015/0063013 A1 | 3/2015 | Iizuka | |
| 2015/0131387 A1 | 5/2015 | Jeon et al. | |
| 2015/0146494 A1 | 5/2015 | Rhio | |
| 2015/0162093 A1* | 6/2015 | Oh ..................... G11C 16/3445 365/185.11 | |
| 2015/0213886 A1 | 7/2015 | Toda | |
| 2015/0279487 A1 | 10/2015 | Pious et al. | |
| 2015/0378887 A1 | 12/2015 | Lee et al. | |
| 2015/0380097 A1* | 12/2015 | Sato ......................... G11C 8/08 365/185.03 | |
| 2016/0093800 A1 | 3/2016 | Matsunami | |
| 2016/0125956 A1* | 5/2016 | Magia ................... G06F 3/0619 714/719 | |
| 2016/0172034 A1 | 6/2016 | Oh et al. | |
| 2016/0180948 A1 | 6/2016 | Tanabe | |
| 2016/0260482 A1 | 9/2016 | Sugimae et al. | |
| 2017/0242608 A1* | 8/2017 | Tailliet .................... G06F 3/061 | |
| 2018/0143762 A1* | 5/2018 | Kim ................... G11C 11/5642 | |
| 2018/0197586 A1* | 7/2018 | Nguyen ................. G11C 16/08 | |
| 2018/0261620 A1* | 9/2018 | Lee ................... H01L 27/11582 | |
| 2018/0286921 A1* | 10/2018 | Redaelli ............. G11C 11/5678 | |
| 2018/0299921 A1 | 10/2018 | Rajwani et al. | |
| 2018/0322094 A1 | 11/2018 | Friedman et al. | |
| 2018/0358102 A1* | 12/2018 | Zhang ................ G11C 16/3459 | |
| 2019/0013063 A1* | 1/2019 | Liu ......................... G11C 7/1057 | |
| 2019/0043560 A1 | 2/2019 | Sumbul et al. | |
| 2019/0259462 A1* | 8/2019 | Lu ........................... G11C 16/30 | |
| 2019/0393268 A1* | 12/2019 | Lai ......................... H01L 27/2481 | |

\* cited by examiner

| CLE | COMMAND LATCH ENABLE |
| --- | --- |
| ALE | ADDRESS LATCH ENABLE |
| nCE | CHIP ENABLE |
| nRE | READ ENABLE |
| nWE | WRITE ENABLE |

FIG. 15

| MODE / VOLTAGE | VOLTAGE LEVEL SETTING VALUE | | TIMING SETTING VALUE | |
| --- | --- | --- | --- | --- |
| | SINGLE MAT | MULTI MAT | SINGLE MAT | MULTI MAT |
| VSSSL | 5.5V | 5.7V | 20us | 21us |
| PREP1 | 5.7V | 6.0V | 8us | 8.4us |
| PSTP1 | 5.5V | 5.8V | 6us | 6.5us |
| PREP2 | 5.3V | 5.5V | 8us | 8.2us |
| VR | 0.5V | 0.9V | 10us | 10.4us |
| PSTP2 | 5.0V | 5.4V | 6us | 6.4us |
| VRPASS | 6.0V | 6.5V | 20us | 21.5us |
| VPCH | 0.8V | 1.0V | 7us | 7.2us |
| VCMP | 0.7V | 0.9V | 6us | 6.4us |
| OD | 0.0V | 0.4V | 1.5us | 1.8us |

FIG. 17

| MODE<br>VOLTAGE | VOLTAGE LEVEL SETTING VALUE | | TIMING SETTING VALUE | |
|---|---|---|---|---|
| | SINGLE MAT | MULTI MAT | SINGLE MAT | MULTI MAT |
| VWSTP | 0V | 1V | 5us | 7us |
| VPGM | 19V | 20V | 10us | 12us |
| VPV | 1V | 1.2V | 15us | 17us |
| VPPASS1 | 8V | 9.5V | 4us | 4.5us |
| VPPASS2 | 10V | 12V | 8us | 10us |
| VRPASS | 8V | 9V | 20us | 22us |
| VBSTP | 2V | 2.2V | 17us | 19us |
| VPCH | 0.5V | 0.7V | 15us | 17us |
| OD | 0.2V | 0.3V | 2us | 2.5us |

NONVOLATILE MEMORY DEVICES AND MEMORY SYSTEMS

CROSS-REFERENCE TO RELATED APPLICATION

This U.S. Non-provisional application is a Continuation of U.S. patent application Ser. No. 16/183,315, filed on Nov. 7, 2018, which is a Divisional Application of U.S. patent application Ser. No. 15/604,406 filed on May 24, 2017, now U.S. Pat. No. 10,153,029, which claims priority under 35 USC § 119 to Korean Patent Application No. 10-2016-0099219, filed on Aug. 4, 2016, in the Korean Intellectual Property Office (KIPO), the disclosure of each of which is incorporated by reference in its entirety herein.

BACKGROUND

1. Technical Field

Exemplary embodiments relate generally to semiconductor memory devices, and more particularly to nonvolatile memory devices and memory systems.

2. Discussion of the Related Art

Semiconductor memory devices may be typically classified into volatile semiconductor memory devices and nonvolatile semiconductor memory devices. Volatile semiconductor memory devices may perform read and write operations at a high speed, while contents stored therein may be lost when the devices are powered-off. Nonvolatile semiconductor memory devices may retain contents stored therein even when powered-off. For this reason, nonvolatile semiconductor memory devices may be used to store contents to be retained regardless of whether the devices are powered on or off.

Nonvolatile semiconductor memory devices may include a mask read-only memory (MROM), a programmable ROM (PROM), an erasable programmable ROM (EPROM), an electrically erasable programmable ROM (EEPROM), etc.

A flash memory device may be a typical nonvolatile memory device. A flash memory device may be widely used as the voice and image storing media of electronic apparatuses such as a computer, a cellular phone, a PDA, a digital camera, a camcorder, a voice recorder, an MP3 player, a handheld PC, a game machine, a facsimile, a scanner, a printer, etc. For improving the performance of read/write operation of flash memory devices, flash memory devices may operate in a multi-plane mode. However, it is desired to reduce a load of word-lines or bit-lines of the flash memory devices operating in the multi-plane mode.

SUMMARY

Some exemplary embodiments are directed to a nonvolatile memory device, capable of enhancing performance.

Some exemplary embodiments are directed to provide a memory system, capable of enhancing performance.

According to exemplary embodiments, a nonvolatile memory device includes a memory cell array, a voltage generator, a page buffer circuit, a row decoder and a control circuit. The memory cell array includes a plurality of mats corresponding to different bit-lines, and each of the plurality mats includes a plurality of memory blocks. Each of the plurality of memory blocks includes a plurality of cell strings connected to a plurality of word-lines and a plurality of bit-lines. The voltage generator generates word-line voltages applied to the memory cell array. The page buffer circuit is coupled to the memory cell array through the bit-lines and provides bit-line voltages to the bit-lines. The row decoder is coupled to the memory cell array through word-lines, and the row decoder transfers the word-line voltages to the plurality of word-lines of the memory cell array. The control circuit controls the voltage generator, the row decoder and the page buffer circuit based on a command and an address. The control circuit selects different voltages to apply the selected different voltages to at least one of the word-lines or at least one of the bit-lines according to a number of mats of the plurality mats, which operate simultaneously.

According to exemplary embodiments, a nonvolatile memory device includes a memory cell array, a voltage generator, a page buffer circuit, a row decoder and a control circuit. The memory cell array includes a plurality of mats corresponding to different bit-lines, and each of the plurality mats includes a plurality of memory blocks. Each of the plurality of memory blocks includes a plurality of cell strings connected to a plurality of word-lines and a plurality of bit-lines. The voltage generator generates word-line voltages applied to the memory cell array. The page buffer circuit is coupled to the memory cell array through the bit-lines and provides bit-line voltages to the bit-lines. The row decoder is coupled to the memory cell array through word-lines, and the row decoder transfers the word-line voltages to the plurality of word-lines of the memory cell array. The control circuit controls the voltage generator, the row decoder and the page buffer circuit based on a command and an address. The control circuit applies voltages to at least one of the word-lines or at least one of the bit-lines during a selected time interval from among a plurality of different time intervals, the selected time interval selected according to a number of mats of the plurality mats, which operate simultaneously.

According to exemplary embodiments, a memory system includes at least one nonvolatile memory device and a memory controller. The memory controller controls the at least one nonvolatile memory device. The nonvolatile memory device includes a memory cell array, a voltage generator, a page buffer circuit, a row decoder and a control circuit. The memory cell array includes a plurality of mats corresponding to different bit-lines, and each of the plurality mats includes a plurality of memory blocks. Each of the plurality of memory blocks includes a plurality of cell strings connected to a plurality of word-lines and a plurality of bit-lines. The voltage generator generates word-line voltages applied to the memory cell array. The page buffer circuit is coupled to the memory cell array through the bit-lines. The row decoder is coupled to the memory cell array through word-lines, and the row decoder transfers the word-line voltages to the plurality of word-lines of the memory cell array. The control circuit controls the voltage generator, the row decoder and the page buffer circuit based on a command and an address from the memory controller. The control circuit applies different voltages to at least one of the word-lines or at least one of the bit-lines or controls a time interval during which voltages applied to at least one of the word-lines or at least one of the bit-lines are applied according to a number of mats of the plurality mats, which operate simultaneously. The memory controller includes a decision circuit to determine the number of the mats which operate simultaneously.

According to exemplary embodiments, a nonvolatile memory device includes a memory cell array including a plurality of planes, each of first and second planes of the planes including a plurality of memory blocks, each of the memory blocks including a plurality of cell strings, a first cell string of the cell strings of the first plane connected to a first set of word-lines and a first bit-line, and a second cell string of the cell strings of the second plane connected to a second set of word-lines and a second bit-line, a voltage generator connected to the first and second sets of word-lines and configured to provide word-line voltages to at least one set of the first and second sets of word-lines, and a control circuit configured to control at least one of the word-line voltages applied to at least one word-line of the first and second sets of word-lines based on whether one or both planes of the first and second planes operate simultaneously. The control circuit is configured to control the word-line voltages by: either applying a first voltage, for a first specific period of time, to at least one word-line of the plurality of first and second word-lines when only one of the first and second planes operates and applying a second voltage different from the first voltage, for the first specific period of time, to the at least one word-line when both of the first and second planes simultaneously operate, or applying a first voltage to at least one word-line of the plurality of first and second word-lines for a first period of time when only one of the first and second planes operates and applying the first voltage to the at least one word-line for a second period of time different from the first period of time when both of the first and second planes simultaneously operate.

Accordingly, in a nonvolatile memory device and a memory system according to exemplary embodiments, levels or application time intervals of the voltages applied to the memory cell array are differentiated in a single mat mode and a multi-mat mode, and performance in both the single mat mode and the multi-mat mode may be enhanced.

BRIEF DESCRIPTION OF THE DRAWINGS

Illustrative, non-limiting exemplary embodiments will be more clearly understood from the following detailed description in conjunction with the accompanying drawings.

FIG. 15 is a table illustrating setting values of levels and application time interval of the word-line voltages and the bit-line voltages applied to the first second mats in FIGS. 13 and 14 when a read operation is performed on the nonvolatile memory device of FIG. 3, according to exemplary embodiments

FIG. 17 is a table illustrating setting values of levels and application time interval of the word-line voltages and the bit-line voltages applied to the first second mats in FIG. 16 when the program operation is performed on the nonvolatile memory device of FIG. 3, according to exemplary embodiments.

DETAILED DESCRIPTION OF THE EMBODIMENTS

Various exemplary embodiments will be described more fully hereinafter with reference to the accompanying drawings, in which some exemplary embodiments are shown.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as that, although the terms first, second, third etc. may be used herein to describe various elements, these elements should elements of the list.

Expressions such as "at least one of," when preceding a list of elements, modify the entire list of elements and do not modify the individual elements of the list.

Figures 1, 2:
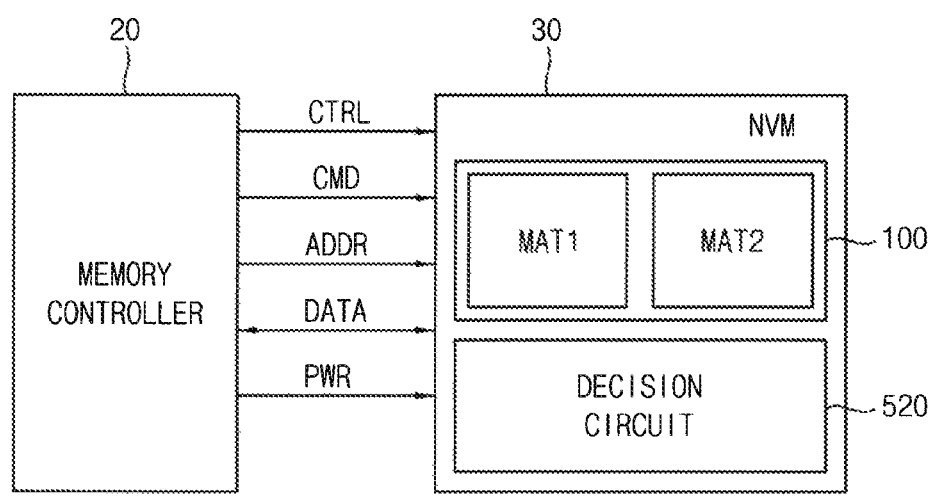
FIG. 1 is a block diagram illustrating a memory system according to exemplary embodiments.
FIG. 2 is a table illustrating control signals in the memory system of FIG. 1.

FIG. 1 is a block diagram illustrating a memory system according to exemplary embodiments.

Referring to FIG. 1, a memory system (or, a nonvolatile memory system) 10 may include a memory controller 20 and at least one nonvolatile memory device 30.

The memory system 10 may include data storage media based flash memory such as a memory card, a universal serial bus (USB) memory and solid state drive (SSD).

The nonvolatile memory device 30 may perform a read operation, an erase operation, and a program operation or a write operation under control of the memory controller 20. The nonvolatile memory device 30 receives a command CMD, an address ADDR and data DATA through input/output lines from the memory controller 20 for performing such operations. In addition, the nonvolatile memory device 30 receives a control signal CTRL through a control line from the memory controller 20. The nonvolatile memory device 30 receives a power PWR through a power line from the memory controller 20.

The nonvolatile memory device 30 may include a memory cell array 100 and a decision circuit 520. The memory cell array 100 may include at least a first mat MAT1 and a second mat MAT2. Each of the first mat MAT1 and the second mat MAT2 may include a plurality of memory blocks. Each block of the plurality of memory blocks may include a plurality of cell strings each cell string including a plurality of transistors connected to a plurality of word-lines and a plurality of bit-lines. The first mat MAT1 may be referred to as a first plane PLANE1 and the second mat MAT2 may be referred to as a second plane PLANE2. The decision circuit 520 may determine one of a single mat mode and a multi-mat mode of the first mat MAT1 and the second mat MAT2.

FIG. 2 is a table illustrating control signals in the memory system of FIG. 1.

Referring to FIGS. 1 and 2, the control signal CTRL, which the memory controller 20 applies to the nonvolatile memory device 30, may include, a command latch enable signal CLE, an address latch enable signal ALE, a chip enable signal nCE, a read enable signal nRE, and a write enable signal nWE.

The memory controller 20 may transmit the command latch enable signal CLE to the nonvolatile memory device 30. For example, the memory controller 20 may transmit the command latch enable signal CLE to the nonvolatile memory device 30 via a separately assigned control pin. The command latch enable signal CLE may be a signal indicating that information transferred via the input/output lines is a command.

The memory controller 20 may transmit the address latch enable signal ALE to the nonvolatile memory device 30. The memory controller 20 may transmit the address latch enable signal ALE to the nonvolatile memory device 30 via a separately assigned control pin. The address latch enable signal ALE may be a signal indicating that information transferred via the input/output lines is an address.

The memory controller 20 may transmit the chip enable signal nCE to the nonvolatile memory device 30. The memory controller 20 may transmit the chip enable signal nCE to the nonvolatile memory device 30 via a separately assigned control pin. The chip enable signal nCE may indicate a memory chip selected from among a plurality of memory chips when the nonvolatile memory device includes the plurality of memory chips. For example, the chip enable signal nCE may include one or more chip enable signals nCEs.

The memory controller 20 may transmit the read enable signal nRE to the nonvolatile memory device 30. The memory controller 20 may transmit the read enable signal nRE to the nonvolatile memory device 30 via a separately assigned control pin. The nonvolatile memory device 30 may transmit read data to the memory controller 20 based on the read enable signal nRE.

The memory controller 20 may transmit the write enable signal nWE to the nonvolatile memory device 30. The memory controller 20 may transmit the write enable signal nWE to the nonvolatile memory device 30 via a separately assigned control pin. When the write enable signal nWE is activated, the nonvolatile memory device 30 may store data input signals provided from the memory controller 20 to the memory cell array 100 of the nonvolatile memory device 30.

Figure 3:
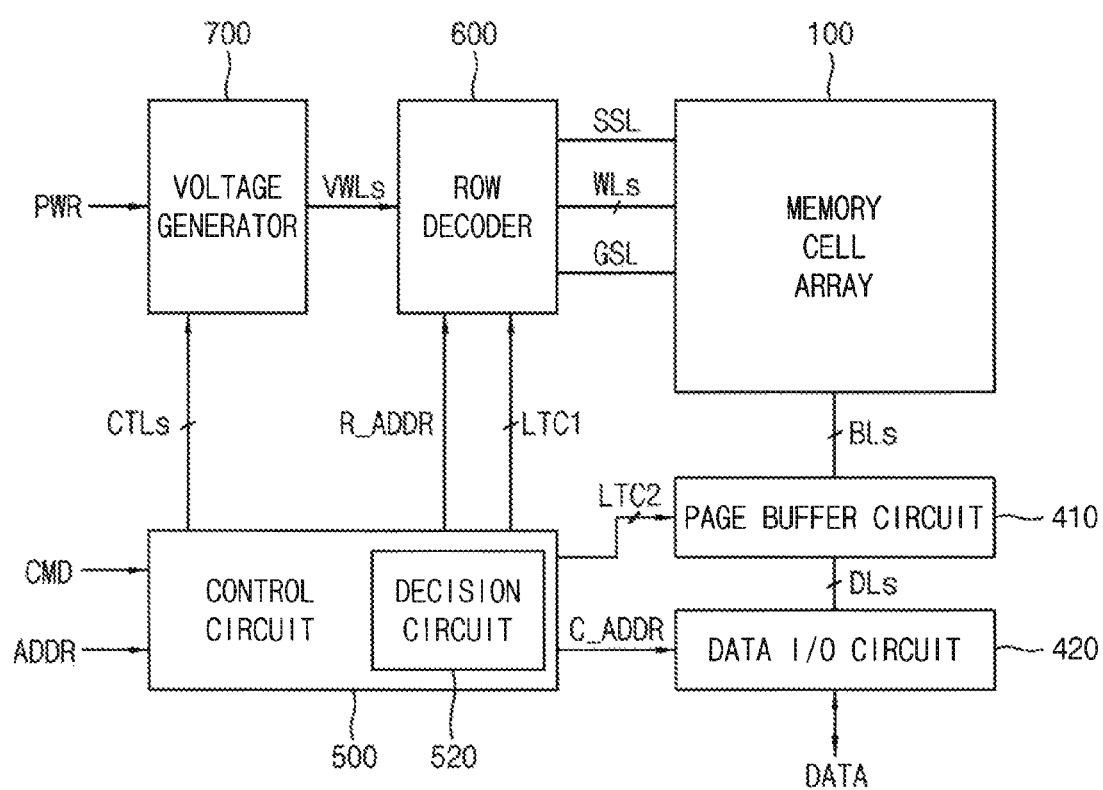
FIG. 3 is a block diagram illustrating the nonvolatile memory device in the memory system of FIG. 1 according to exemplary embodiments.

FIG. 3 is a block diagram illustrating the nonvolatile memory device in the memory system of FIG. 1 according to exemplary embodiments.

Referring to FIG. 3, the nonvolatile memory device 30 includes a memory cell array 100, a row decoder 600, a page buffer circuit 410, a data input/output circuit 420, a control circuit 500, and a voltage generator 700 (e.g., a word-line voltage generator). The control circuit 500 may include the decision circuit 520.

The memory cell array 100 may be coupled to the row decoder 600 through a string selection line SSL, a plurality of word-lines WLs, and a ground selection line GSL. In addition, the memory cell array 100 may be coupled to the page buffer circuit 410 through a plurality of bit-lines BLs.

The memory cell array 100 may include a plurality of memory cells coupled to the plurality of word-lines WLs and the plurality of bit-lines BLs.

In some exemplary embodiments, the memory cell array 100 may be a three-dimensional memory cell array, which is formed on a substrate in a three-dimensional structure (or a vertical structure). In this case, the memory cell array 100 may include vertical cell strings that are vertically oriented such that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648.

In other exemplary embodiments, the memory cell array 100 may be a two-dimensional memory cell array, which is formed on a substrate in a two-dimensional structure (or a horizontal structure).

Referring still to FIG. 3, the row decoder 600 may select at least one of a plurality of memory blocks of the plurality of mats of the cell array 100 in response to an address ADDR from the memory controller 20. For example, the row decoder 600 may select at least one of a plurality of word-lines in the selected one or more memory blocks. The row decoder 600 may transfer a voltage (e.g., a word-line voltage) generated from the voltage generator 700 to a selected word-line. At a program operation, the row decoder 600 may transfer a program voltage or a verification voltage to a selected word-line and a pass voltage to an unselected word-line. At a read operation, the row decoder 600 may transfer a selection read voltage to a selected word-line and a non-selection read voltage to an unselected word-line.

The page buffer circuit 410 may operate as a write driver at a program operation and a sense amplifier at a read operation. At a program operation, the page buffer circuit 410 may provide a bit-line of the memory cell array 100 with a bit-line voltage corresponding to data to be programmed. At a read or verification read operation, the page buffer circuit 410 may sense data stored in a selected memory cell via a bit-line. The page buffer circuit 410 may include a plurality of page buffers PB1 to PBn each connected with one bit-line or two bit-lines.

The control circuit 500 may generate a plurality of control signals CTLs, a first control signal LTC1, and a second control signal LTC2 based on the command signal CMD. The control circuit 500 may also generate a row address R_ADDR and a column address C_ADDR based on the address signal ADDR. A detailed description for the control circuit 500 will be described later.

In example embodiments, the nonvolatile memory device 30 may further include a voltage generator (not shown) for supplying a variable voltage to a selected bit-line of the memory cell array 100 through the page buffer circuit 410. In other example embodiments, the page buffer circuit 410 may include the voltage generator (not shown) applying a variable voltage to a selected bit-line of the memory cell array 100.

Figure 4:
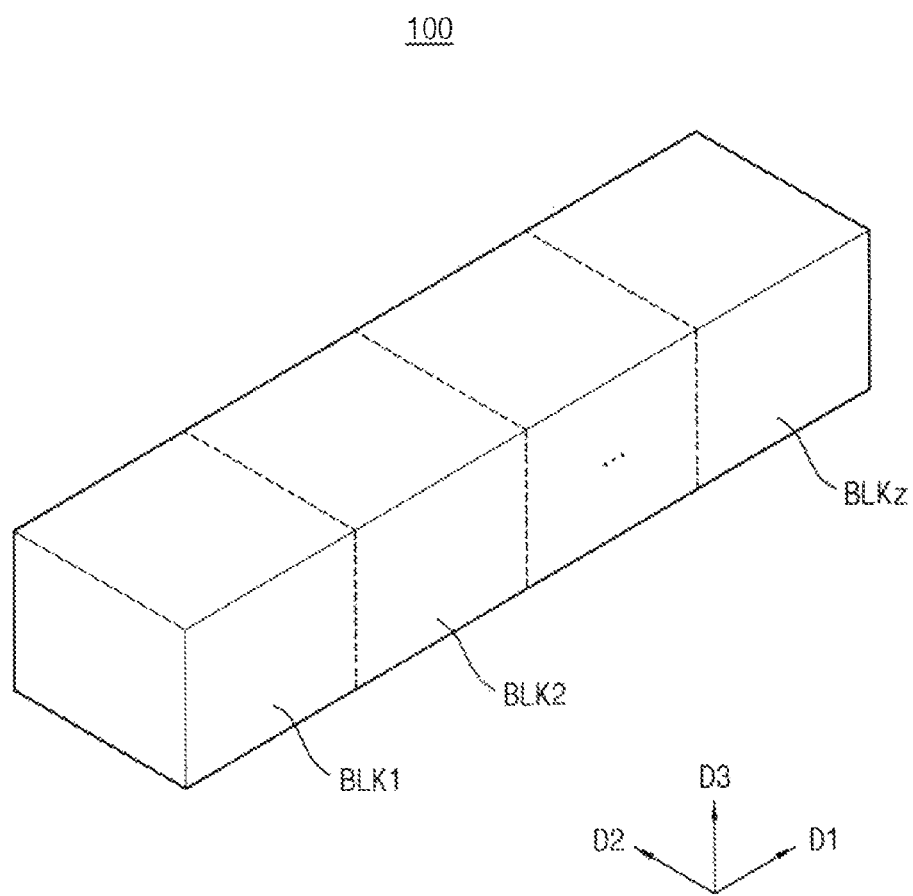
FIG. 4 is a block diagram illustrating the memory cell array in FIG. 3 according to exemplary embodiments.

FIG. 4 is a block diagram illustrating the memory cell array in FIG. 3 according to exemplary embodiments.

Referring to FIG. 4, the memory cell array 100 may include a plurality of memory blocks BLK1 to BLKz which extend in a plurality of directions D1, D2 and D3. In particular, each of the first mat MAT1 (or the first plane PLANE1) and the second mat MAT2 (or the second plane PLANE2) may include the plurality of memory blocks BLK1 to BLKz. In an embodiment, the memory blocks BLK1 to BLKz are selected by the row decoder 600 in FIG. 3. For one example, the row decoder 600 may select a particular memory block BLK corresponding to a block address among the memory blocks BLK1 to BLKz of one of the first and second mats MAT1 and MAT2. For another example, the row decoder 600 may select two particular memory blocks BLKs corresponding to a block address among the memory blocks BLK1 to BLKz of each of the first and second mats MAT1 and MAT2.

Figure 5:
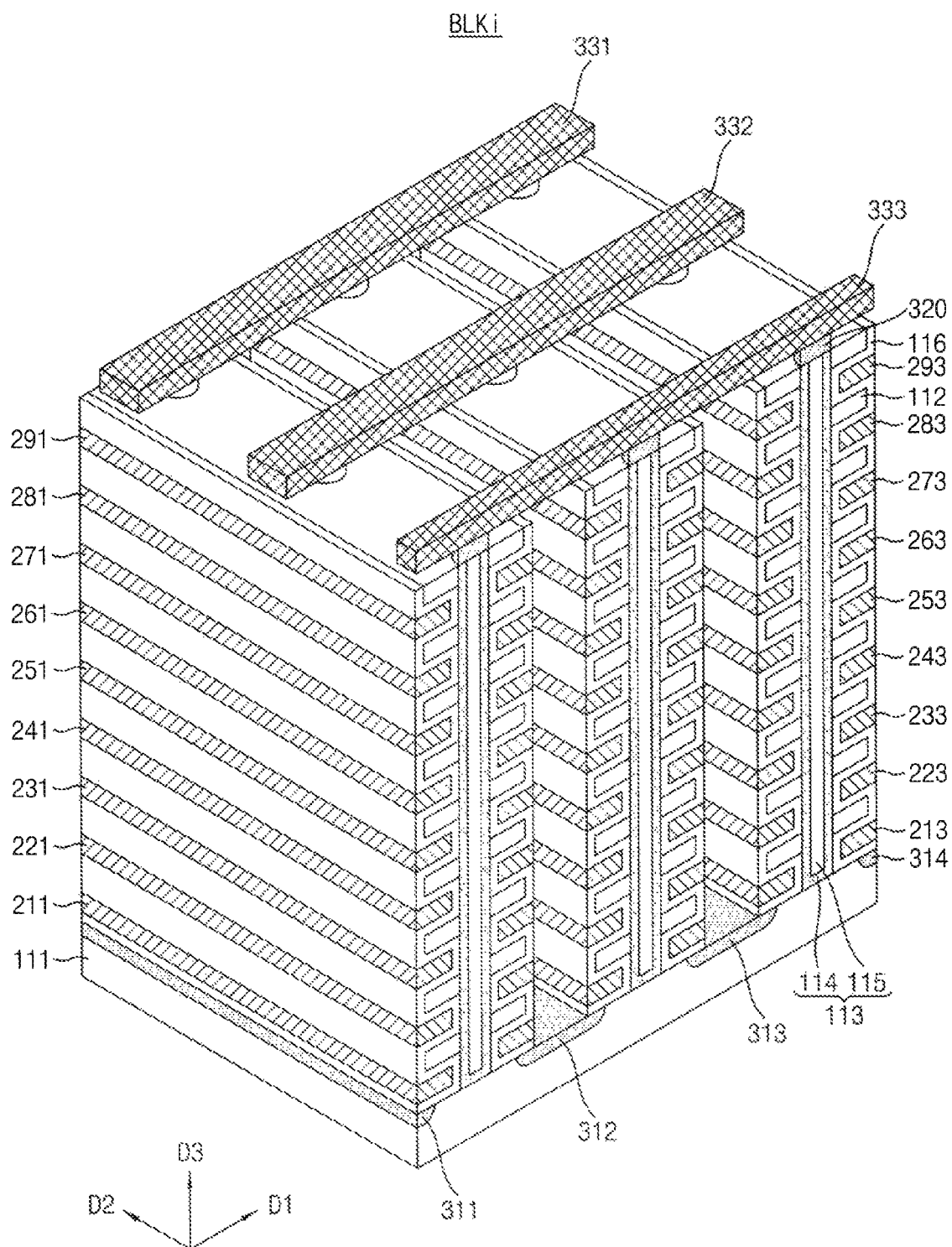
FIG. 5 is a perspective view illustrating one of the memory blocks of FIG. 4 according to exemplary embodiments.

FIG. 5 is a perspective view illustrating one of the memory blocks of FIG. 4 according to exemplary embodiments.

Referring to FIG. 5, a memory block BLKi includes structures extending along the first to third directions D1~D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an embodiment, the substrate 111 has a p-type well (or a p-type pocket well). However, the conductive type of the substrate 111 is not limited to the p-type.

A plurality of doping regions 311 to 314 extending along the first direction D1 are provided in/on the substrate 111. For example, the plurality of doping regions 311 to 314 may have a second type (e.g., a second conductive type) different from the first type of the substrate 111. In an embodiment, the first to fourth doping regions 311 to 314 have an n-type. However, the conductive type of the first to fourth doping regions 311 to 314 is not limited to the n-type.

A plurality of insulation materials 112 extending along the second direction D2 are sequentially provided along the third direction D3 on a region of the substrate 111 between the first and second doping regions 311 and 312. For example, the plurality of insulation materials 112 are provided along the third direction D3, being spaced by a specific distance. Exemplarily, the insulation materials 112 may include an insulation material such as an oxide layer.

A plurality of pillars 113 penetrating the insulation materials along the third direction D3 are sequentially disposed along the second direction D2 on a region of the substrate 111 between the first and second doping regions 311 and 312. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In an embodiment, the channel layer 114 of each pillar 113 includes a p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. For example, the inner material 115 of each pillar 113 may include an air gap.

An insulation layer 116 is provided along the exposed surfaces of the insulation materials 112, the pillars 113, and the substrate 111, on a region between the first and second doping regions 311 and 312. Exemplarily, the insulation layer 116 provided on the exposed surface in the third direction D3 of the last insulation material 112 may be removed.

A plurality of first conductive materials 211 to 291 is provided between second doping regions 311 and 312 on the exposed surfaces of the insulation layer 116. For example, the first conductive material 211 extending along the second direction D2 is provided between the substrate 111 and the insulation material 112 adjacent to the substrate 111.

A first conductive material extending along the first direction D1 is provided between the insulation layer 116 at the top of a specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may include a metal material. The first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of conductive materials 213 to 293 extending along the first direction D1.

In a region between the third and fourth doping regions 313 and 314, the same structures as those on the first and second doping regions 311 and 312 may be provided. In the region between the third and fourth doping regions 313 and 314, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of first conductive materials 213 to 293 extending along the first direction D1.

Drains 320 are provided on the plurality of pillars 113, respectively. The drains 320 may include silicon materials doped with a second type. For example, the drains 320 may include silicon materials doped with an n-type. In an embodiment, the drains 320 include n-type silicon materials. However, the drains 320 are not limited to the n-type silicon materials.

On the drains, the second conductive materials 331 to 333 extending along the first direction D1 are provided. The second conductive materials 331 to 333 are disposed along the second direction D2, being spaced by a specific distance. The second conductive materials 331 to 333 are respectively connected to the drains 320 in a corresponding region. The drains 320 and the second conductive material 333 extending along the first direction D1 may be connected through each contact plug. The second conductive materials 331 to 333 may include metal materials. The second conductive materials 331 to 333 may include conductive materials such as a polysilicon.

In example embodiments, each of the first conductive materials 211 to 291 may form a word-line or a selection line SSL/GSL. The first conductive materials 221 to 281 may be used as word-lines, and first conductive materials formed at the same layer may be interconnected. The memory block BLKi may be selected when the first conductive materials 211 to 291 all are selected. On the other hand, a sub-block may be selected by selecting a part of the first conductive materials 211 to 291.

The number of layers at which first conductive materials 211 to 291 are formed may not be limited to this disclosure. It is well understood that the number of layers at which the first conductive materials 211 to 291 are formed is changed according to a process technique and a control technique.

In example embodiments, each of the second conductive materials 331 to 333 may form a bit-line and each of the doping regions 311 to 314 may form a common source line of the cell strings.

Figure 6:
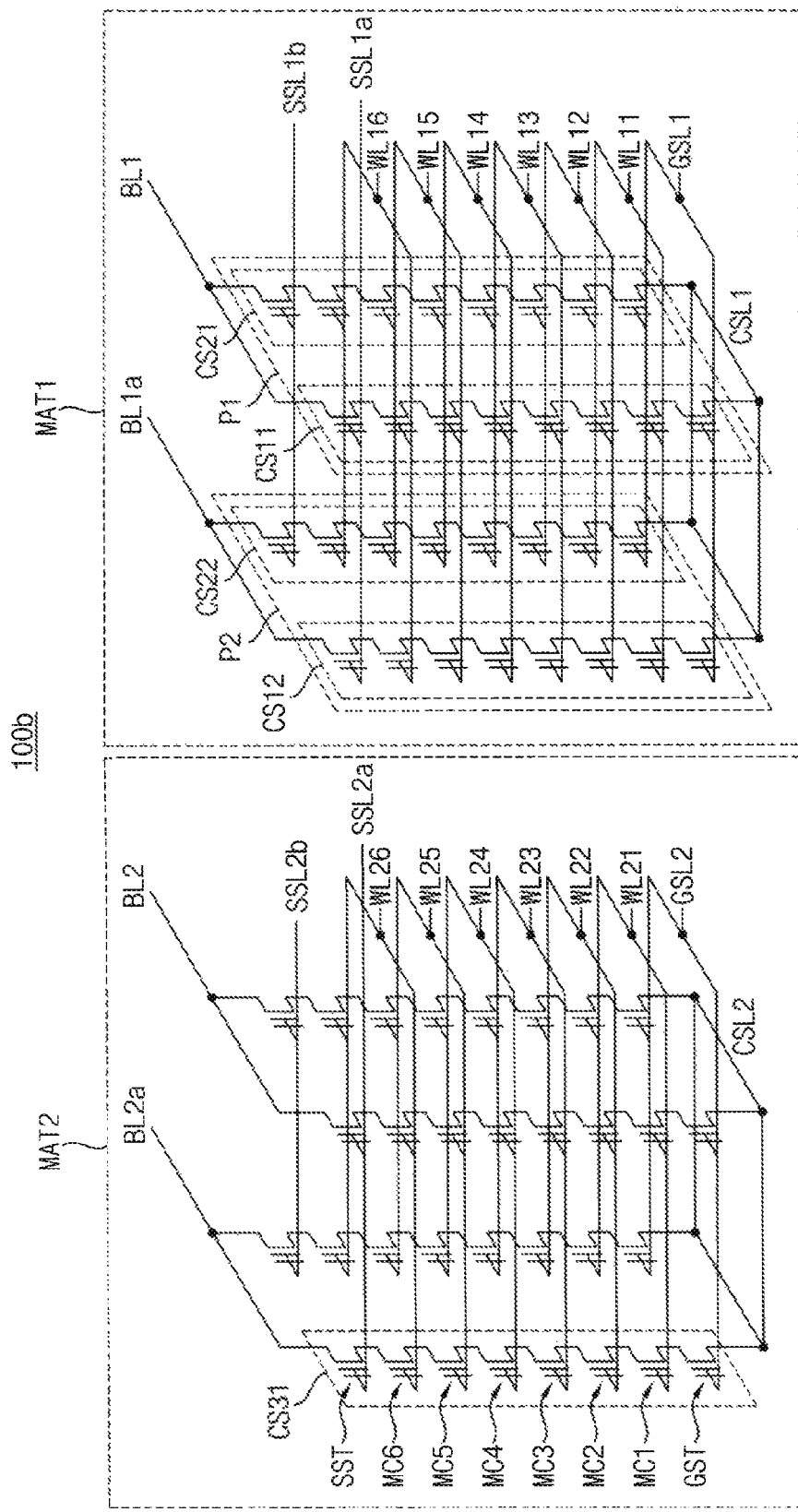
FIG. 6 is a circuit diagram illustrating a mat configuration in the nonvolatile memory device of FIG. 3 according to exemplary embodiments.

FIG. 6 is a circuit diagram illustrating a mat configuration in the nonvolatile memory device of FIG. 3 according to exemplary embodiments.

Referring to FIG. 6, a memory cell array 100b including first and second mats MAT1 and MAT2 is illustrated. Each of the first and second mats MAT1 and MAT2 includes a plurality of memory blocks, and each of the memory blocks includes a plurality of cell strings. For example, a memory block of the first mat MAT1 includes a plurality of cell strings CS11, CS12, CS21, and CS22. The plurality of cell strings in a mat may be formed in a plane. Each of the first and second mats MAT1 and MAT2 includes a plurality of memory blocks, and one of the memory blocks has multiple string selection lines SSL1a and SSL1b to select at least one of the cell strings CS11, CS12, CS21, and CS22. For example, when a selection voltage is applied to a first string selection line SSL1a, the first and second cell strings CS11 and CS12 may be selected. When a selection voltage is applied to a second string selection line SSL1b, third and fourth cell strings CS21 and CS22 may be selected.

In some embodiments, the first and second mats MAT1 and MAT2 may have the same physical structure. For example, like the first mat MAT1, the second mat MAT2 may include multiple memory blocks and multiple cell strings formed in a memory block of the multiple memory blocks. Also, the second mat MAT2 may include multiple string selection lines SSL2a and SSL2b to select at least one of multiple cell strings.

Each of the first and second mats MAT1 and MAT2 may be coupled to corresponding word-lines and a common source line. The cell strings in the first mat MAT1 may be coupled to word-lines WL11~WL16, a ground selection line GSL1 and a common source line CSL1. The cell strings in the second mat MAT2 may be coupled to word-lines WL21~WL26, a ground selection line GSL2 and a common source line CSL2.

The first and second mats MAT1 and MAT2 do not share bit-lines. First bit-lines BL1 and BL1a are coupled to the first mat MAT1 exclusively. Second bit-lines BL2 and BL2a are coupled to the second mat MAT2 exclusively.

Although FIG. 6 illustrates an example in which each mat is connected with two bit-lines and six word-lines, the inventive concept is not limited to these features. For example, each mat can be connected with three or more bit-lines and seven or more word-lines.

Each cell string may include at least one string selection transistor, memory cells, and at least one ground selection transistor. For example, a cell string CS31 of the second mat MAT2 may include a ground selection transistor GST, multiple memory cells MC1 to MC6, and a string selection transistor SST sequentially being perpendicular to a substrate. The remaining cell strings may be formed substantially the same as the cell string CS31.

The first and second mats MAT1 and MAT2 include independent string selection lines. For example, string selection lines SSL1a and SSL1b are only connected with the first mat MAT1, and string selection lines SSL2a and SSL2b are only connected with the second mat MAT2. A string selection line may be used to select cell strings only in a mat. Also, cell strings may be independently selected in every mat by controlling the string selection lines independently.

For example, cell strings CS11 and CS12 may be independently selected by applying a selection voltage only to first string selection line SSL1a. When the selection voltage is applied to first string selection line SSL1a, string selection transistors of cell strings CS11 and CS12 corresponding to first string selection line SSL1a may be turned on by the selection voltage. At this time, memory cells of the cell strings CS11 and CS12 may be electrically connected with a bit-line. When a non-selection voltage is applied to first string selection line SSL1a, string selection transistors of cell strings CS11 and CS12 corresponding to first string selection line SSL1a are turned off by the non-selection voltage. At this time, memory cells of the cell strings CS11 and CS12 are electrically isolated from a bit-line.

Referring back to FIG. 3, the control circuit 500 may receive a command (signal) CMD and an address (signal) ADDR from the memory controller 20 and control an erase loop, a program loop and a read operation of the nonvolatile memory device 30 based on the command signal CMD and the address signal ADDR. The program loop may include a program operation and a program verification operation. The erase loop may include an erase operation and an erase verification operation.

In example embodiments, the control circuit 500 may generate the control signals CTLs, which are used for controlling the voltage generator 700, may generate the first control signal LTC1 for controlling the row decoder 600 and may generate the second control signal LTC2 for controlling the page buffer circuit 410, based on the command signal CMD. The control circuit 500 may generate the row address R_ADDR and the column address C_ADDR based on the address signal ADDR. The control circuit 500 may provide the row address R_ADDR to the row decoder 600 and provide the column address C_ADDR to the data input/output circuit 420. The control circuit 500 may include the decision circuit 520 to determine an operation mode based on a number of mats which operate simultaneously. A concept of plane may be used instead of a concept of the mat.

The row decoder 600 may be coupled to the memory cell array 100 through the string selection line SSL, the plurality of word-lines WLs, and the ground selection line GSL. During the program operation or the read operation, the row decoder 600 may determine one of the plurality of word-lines WLs as the selected word-line and determine rest of the plurality of word-lines WLs except for the selected word-line as unselected word-lines based on the row address R_ADDR.

The voltage generator 700 may generate word-line voltages VWLs, which are required for the operation of the memory cell array 100 of the nonvolatile memory device 30, based on the control signals CTLs. The voltage generator 700 may receive the power PWR from the memory controller 20. The word-line voltages VWLs may be applied to the plurality of word-lines WLs through the row decoder 600. The voltage generator 700 may also generate a string selection voltage and a ground selection voltage, which are required for the operation of the memory cell array 100 of the nonvolatile memory device 30, based on the control signals CTLs. The string selection voltage and the ground selection voltage may be applied to the string selection line SSL and the ground selection line GSL, respectively through the row decoder 600.

For example, during the erase operation, the voltage generator 700 may apply an erase voltage to a well of a memory block and may apply a ground voltage to entire word-lines of the memory block. During the erase verification operation, the voltage generator 700 may apply an erase verification voltage to the entire word-lines of the memory block or sequentially apply the erase verification voltage to word-lines in a word-line basis.

For example, during the program operation, the voltage generator 700 may apply a program voltage to the selected word-line and may apply a program pass voltage to the unselected word-lines. In addition, during the program verification operation, the voltage generator 700 may apply a program verification voltage to the selected word-line and may apply a verification pass voltage to the unselected word-lines.

In addition, during the read operation, the voltage generator 700 may apply a read voltage to the selected word-line and may apply a read pass voltage to the unselected word-lines.

The page buffer circuit 410 may be coupled to the memory cell array 100 through the plurality of bit-lines BLs. The page buffer circuit 410 may include a plurality of page buffers. In some exemplary embodiments, one page buffer may be connected to one bit-line. In other exemplary embodiments, one page buffer may be connected to two or more bit-lines.

The page buffer circuit 410 may temporarily store data to be programmed in a selected page or data read out from the selected page of the memory cell array 100.

The data input/output circuit 420 may be coupled to the page buffer circuit 410 through data lines DLs. During the program operation, the data input/output circuit 410 may receive program data DATA from the memory controller 20 and provide the program data DATA to the page buffer circuit 410 based on the column address C_ADDR received from the control circuit 500. During the read operation, the data input/output circuit 420 may provide read data DATA, which are stored in the page buffer circuit 410, to the memory controller 20 based on the column address C_ADDR received from the control circuit 500.

In addition, the page buffer circuit 410 and the data input/output circuit 420 read data from a first area of the memory cell array 100 and write the read data to a second area of the memory cell array 100. That is, the page buffer circuit 410 and the data input/output circuit 420 may perform a copy-back operation.

Figure 7:
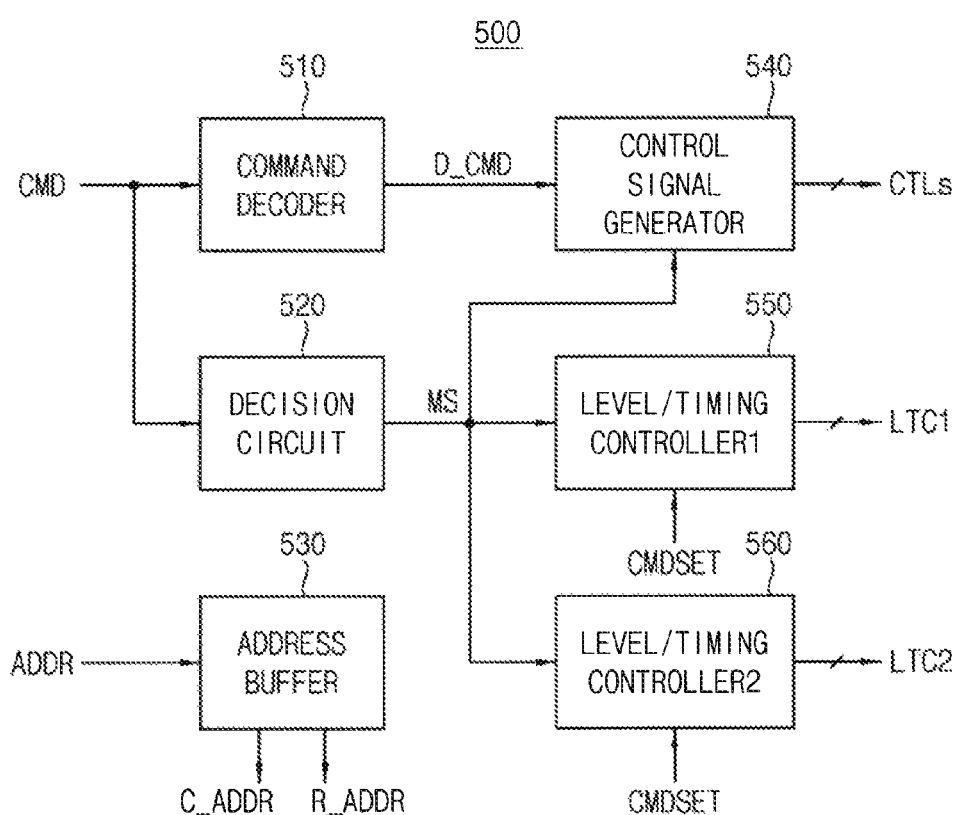
FIG. 7 is a block diagram illustrating the control circuit in the nonvolatile memory device of FIG. 3 according to exemplary embodiments.

FIG. 7 is a block diagram illustrating the control circuit in the nonvolatile memory device of FIG. 3 according to exemplary embodiments.

Referring to FIG. 7, the control circuit 500 includes a command decoder 510, a decision circuit 520, an address buffer 530, a control signal generator 540, a first level/timing controller 550 and a second level/timing controller 560.

The command decoder 510 decodes the command CMD and provides a decoded command D_CMD to the control signal generator 540. The address buffer 530 receives the address signal ADDR, provides the row address R_ADDR to the row decoder 600 and provides the column address C_ADDR to the data input/output circuit 420.

The decision circuit 520 receives the command CMD and generates a mode signal MS designating one of a single mat mode and a multi-mat mode in response to the command CMD. An operation of the nonvolatile memory device is performed on one of the plurality of mats in the single mat mode, and an operation of the nonvolatile memory device is simultaneously performed on at least two mats of the plurality of mats in the multi-mat mode. The single mat mode may be also referred to as a single plane mode or a single speed mode. The multi-mat mode may be also referred to as a multi-plane mode or a multi-speed mode. The decision circuit 520 provides the mode signal MS to the control signal generator 540, the first level/timing controller 550 and the second level/timing controller 560.

The control signal generator 540 receives the decoded command D_CMD and the mode signal MS, generates the control signals CTLs based on an operation directed by the decoded command D_CMD and an operation mode directed by the mode signal MS and provides the control signals CTLs to the voltage generator 700.

The first level/timing controller 550 receives the mode signal MS, generates the first control signal LTC1 based on the mode designated by the mode signal MS, provides the first control signal LTC1 to the row decoder 600. The first level/timing controller 550 receives setting information on levels of the word-line voltages and application time interval of the word-line voltages for the single mat mode and the multi-mat mode as a command set CMDSET from the memory controller 20 and stores the command set CMDSET therein. The first level/timing controller 550 provides the row decoder 600 with the first control signal LTC1 indicating the setting information of the word-line voltages in response to the mode signal MS.

The second level/timing controller 560 receives the mode signal MS, generates the second control signal LTC2 based on the mode designated by the mode signal MS, provides the second control signal LTC2 to the page buffer circuit 410. The second level/timing controller 560 receives setting information on levels of voltages applied to the bit-lines (i.e., bit-line voltages) and application time interval of the bit-line voltages for the single mat mode and the multi-mat mode as the command set CMDSET from the memory controller 20 and stores the command set CMDSET therein. The second level/timing controller 560 provides the page buffer circuit 410 with the second control signal LTC2 indicating the setting information of the bit-line voltages in response to the mode signal MS.

Figure 8:
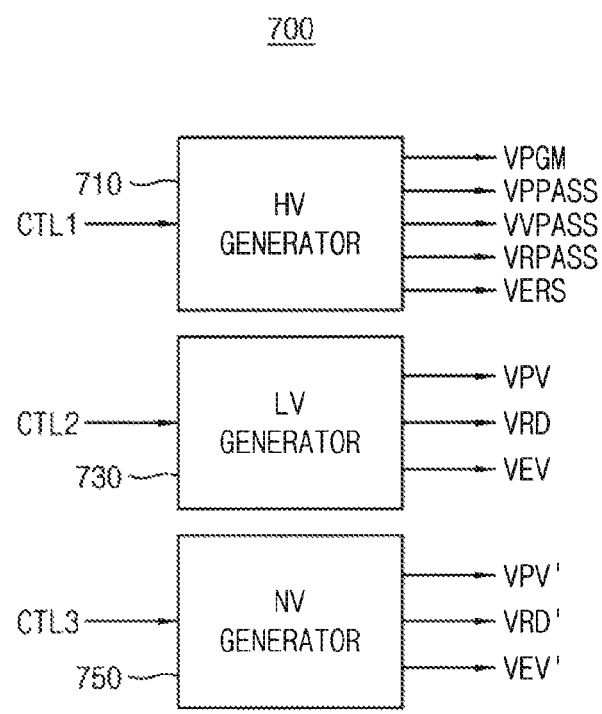
FIG. 8 is a block diagram illustrating the voltage generator in the nonvolatile memory device of FIG. 3 according to exemplary embodiments.

FIG. 8 is a block diagram illustrating the voltage generator in the nonvolatile memory device of FIG. 3 according to exemplary embodiments.

Referring to FIG. 8, the voltage generator 700 may include a high voltage generator 710 and a low voltage generator 730. The voltage generator 700 may further include a negative voltage generator 750.

The high voltage generator 710 may generate a program voltage VPGM, a program pass voltage VPPASS, a verification pass voltage VVPASS, a read pass voltage VRPASS and an erase voltage VERS according to operations directed by the decoded command D_CMD, in response to a first control signal CTL1 of the control signals CTLs.

Levels of the program voltage VPGM, the program pass voltage VPPASS, the verification pass voltage VVPASS, the read pass voltage VRPASS may be different in the single mat mode and the multi-mat mode. The program voltage VPGM is applied to the selected word-line, the program pass voltage VPPASS, the verification pass voltage VVPASS, the read pass voltage VRPASS may be applied to the unselected word-lines and the erase voltage VERS may be applied to the well of the memory block. The first control signal CTL1 may include a plurality of bits which indicate the operations directed by the decoded command D_CMD and the mode designated by the mode signal MS.

The low voltage generator 730 may generate a program verification voltage VPV, a read voltage VRD and an erase verification voltage VEV according to operations directed by the decoded command D_CMD, in response to a second control signal CTL2 of the control signals CTLs. Levels of the program verification voltage VPV, the read voltage VRD and the erase verification voltage VEV may be different in the single mat mode and the multi-mat mode. The program verification voltage VPV, the read voltage VRD and the erase verification voltage VEV may be applied to the selected word-line according to operation of the nonvolatile memory device 30. The second control signal CTL2 may include a plurality of bits which indicate the operations directed by the decoded command D_CMD and the mode designated by the mode signal MS.

The negative voltage generator 750 may generate a program verification voltage VPV', a read voltage VRD' and an erase verification voltage VEV' which have negative levels according to operations directed by the decoded command D_CMD, in response to a third control signal CTL3 of the control signals CTLs. Levels of the program verification voltage VPV', the read voltage VRD' and the erase verification voltage VEV' may be different in the single mat mode and the multi-mat mode. The third control signal CTL3 may include a plurality of bits which indicate the operations directed by the decoded command D_CMD and the mode designated by the mode signal MS.

Although not illustrated, the voltage generator 700 may generate other voltages that will be described in FIGS. 15 and 17.

Figure 9:
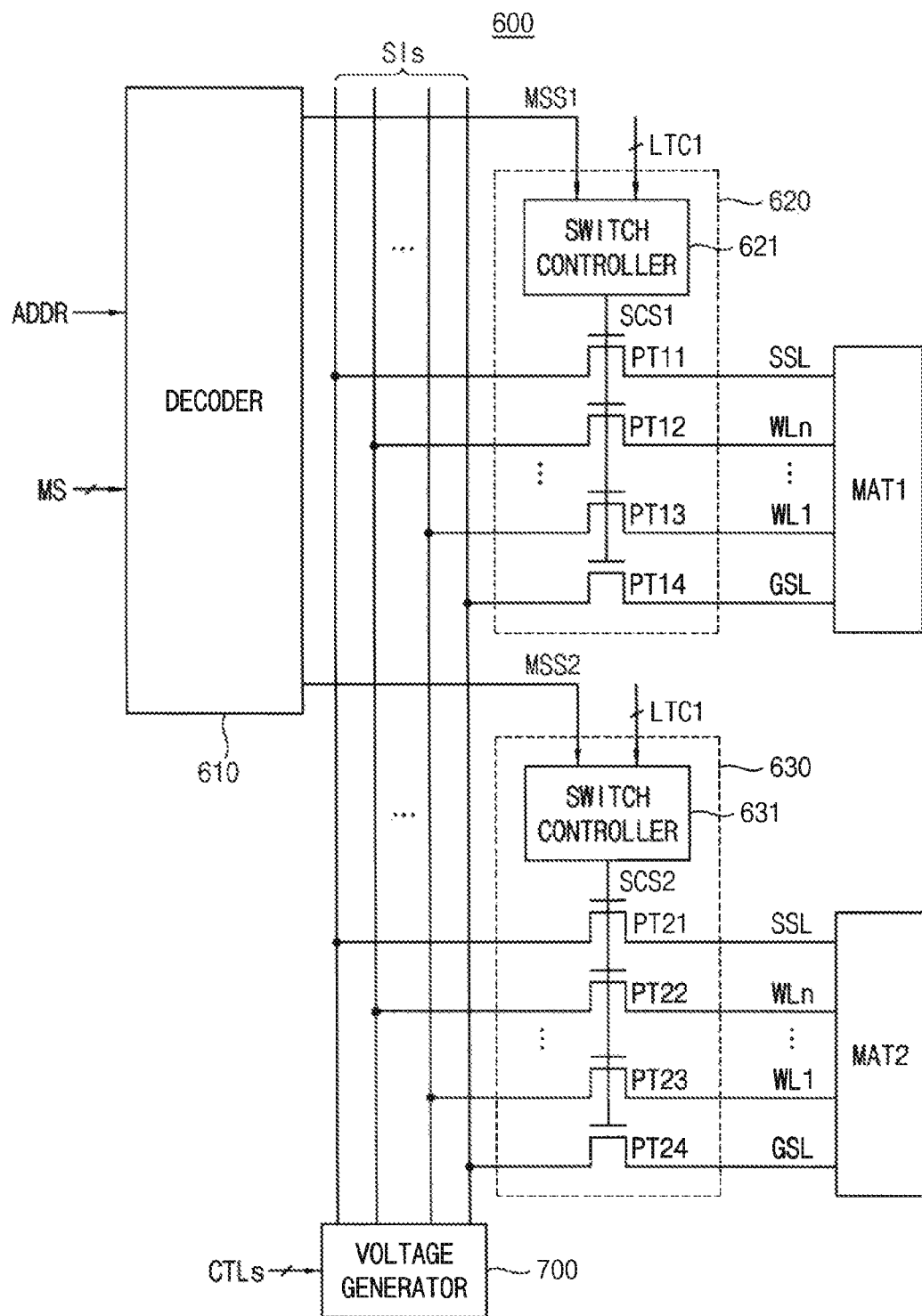
FIG. 9 is a block diagram illustrating a row decoder in the nonvolatile memory device of FIG. 3 according to exemplary embodiments.

FIG. 9 is a block diagram illustrating the row decoder in the nonvolatile memory device of FIG. 3 according to exemplary embodiments.

In FIG. 9, the first mat MAT1 and the second mat MAT2 of the memory cell array 100 and the voltage generator 700 are altogether illustrated.

Referring to FIG. 9, the row decoder 600 includes a decoder 610, a first switch circuit 620 and a second switch circuit 630.

The decoder 610 receives the address ADDR and the mode signal MS, and generates a first mat selection signal MSS1 to select the first mat MAT1 and a second mat selection signal MSS2 to select the second mat MAT2 based on at least one mat designated by the address ADDR and the mode designated by the mode signal MS. When the mode signal MS indicates the single mat mode, the decoder 610 enables one of the first mat selection signal MSS1 and the second mat selection signal MSS2. When the mode signal MS indicates the multi-mat mode, the decoder 610 enables both the first mat selection signal MSS1 and the second mat selection signal MSS2. The decoder 610 provides the first mat selection signal MSS1 and the second mat selection signal MSS2 to the first mat MAT1 and the second mat MAT2 respectively.

The first switch circuit 620 and the second switch circuit 630 may be coupled to a plurality of selection lines Sls coupled to the voltage generator 700. The first switch circuit 620 is coupled to the first mat MAT1 through at least one string selection line SSL, a plurality of word-lines WL1~WLn and at least one ground selection line GSL. The second switch circuit 630 is coupled to the second mat MAT2 through at least one string selection line SSL, a plurality of word-lines WL1~WLn and at least one ground selection line GSL.

The first switch circuit 620 includes a switch controller 621 and a plurality of pass transistors PT11~PT14 coupled to the string selection line SSL, the word-lines WL1~WLn and the ground selection line GSL of the first mat MAT1. The switch controller 621 may control turn-on and turn-off of the pass transistors PT11~PT14 and turn-on timing of the pass transistors PT11~PT14 in response to the first mat selection signal MSS1 and the first control signal LTC1. For example, the switch controller 621 may control turn-on timing (e.g., a time interval) of the pass transistors PT11~PT14 by selecting a particular time interval from among a plurality of different time intervals in response to the first mat selection signal MSS1 and the first control signal LTC1.

The second switch circuit 630 includes a switch controller 631 and a plurality of pass transistors PT21~PT24 coupled to the string selection line SSL, the word-lines WL1~WLn and the ground selection line GSL of the second mat MAT2. The switch controller 631 may control turn-on and turn-off of the pass transistors PT21~PT24 and turn-on timing of the pass transistors PT21~PT24 in response to the second mat selection signal MSS2 and the first control signal LTC1. For example, the switch controller 631 may control turn-on timing (e.g., a time interval) of the pass transistors PT21~PT24 by selecting a particular time interval from among a plurality of different time intervals in response to the second mat selection signal MSS2 and the first control signal LTC1.

When the mode signal MS indicates the single mat mode and the address ADDR designates the first mat MAT1, the first mat selection signal MSS1 is enabled and the second mat selection signal MSS2 is disabled. The switch controller 621 enables a first switching control signal SCS1 during a first time interval (or, a first period of time) to turn-on the pass transistors PT11~PT14 during the first time in response to the first control signal LCT1. Therefore, the word-line voltages VWLs having first levels are applied to the first mat MAT1.

When the mode signal MS indicates a first sub mode of the multi-mat mode, the first and second mat selection signals MSS1 and MSS2 are enabled. The switch controller 621 enables a first switching control signal SCS1 during a first time interval to turn-on the pass transistors PT11~PT14 during the first time interval in response to the first control signal LCT1 and the switch controller 631 enables a second switching control signal SCS2 during the first time interval to turn-on the pass transistors PT21~PT24 during the first time interval in response to the first control signal LCT1. In example embodiments, voltage generator 700 may generate the word-line voltages VWLs in response to the control signals CTLs. In other example embodiments, the voltage generator 700 may generate the word-line voltages VWLs in response to the control signals CTLs and the first control signal LTC1. In this case, the voltage generator 700 may generate the word-line voltages VWLs by selecting one of different voltages in response to the control signals CTLs and the first control signal LTC1. For example, the word-line voltages VWLs having second levels greater than the first levels are applied to the first mat MAT1 and the second mat MAT2.

When the mode signal MS indicates a second sub mode of the multi-mat mode, the first and second mat selection signals MSS1 and MSS2 are enabled. The switch controller 621 enables a first switching control signal SCS1 during a second time interval longer than the first time interval to turn-on the pass transistors PT11~PT14 during the second time interval in response to the first control signal LCT1 and the switch controller 631 enables a second switching control signal SCS2 during the second time interval to turn-on the pass transistors PT21~PT24 during the second time interval in response to the first control signal LCT1. For example, the word-line voltages VWLs having the first levels are applied to the first mat MAT1 and the second mat MAT2.

In example embodiments, each of the first mat MAT1 and the second mat MAT2 may have an associated row decoder for applying word-line voltages to the word-lines. Thus, each of the first mat MAT1 and the second mat MAT2 can be operated separately from each other or simultaneously together based on the mode signal MS, the control signals CTLs, the first control signal LTC1, and the second control signal LTC2.

The word-line voltages VWLs may be transferred to the plurality of word-lines WLs and at least one of the string selection line SSL through the plurality of signal lines SIs.

Figure 10:
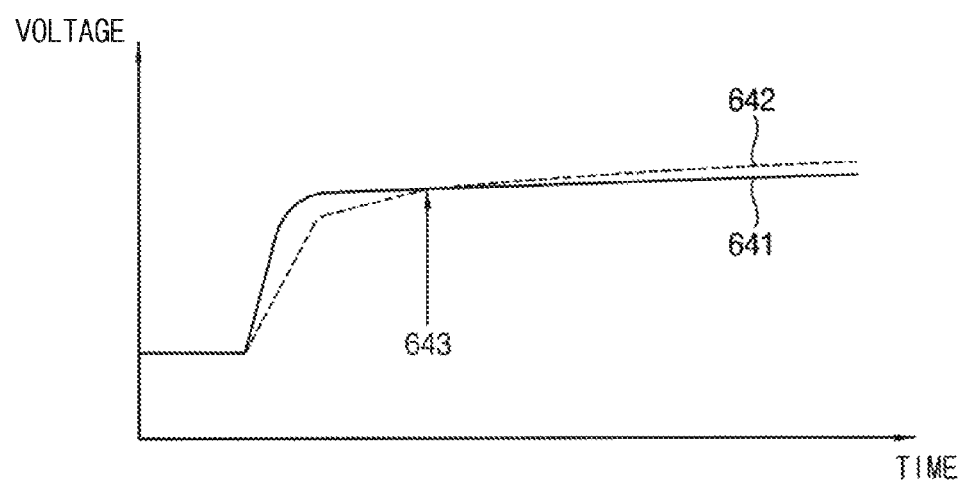
FIGS. 10 and 11 illustrate the word-line voltages or the bit-line voltages in the single mat mode and the multi-mat mode respectively, according to exemplary embodiments.
Figure 11:
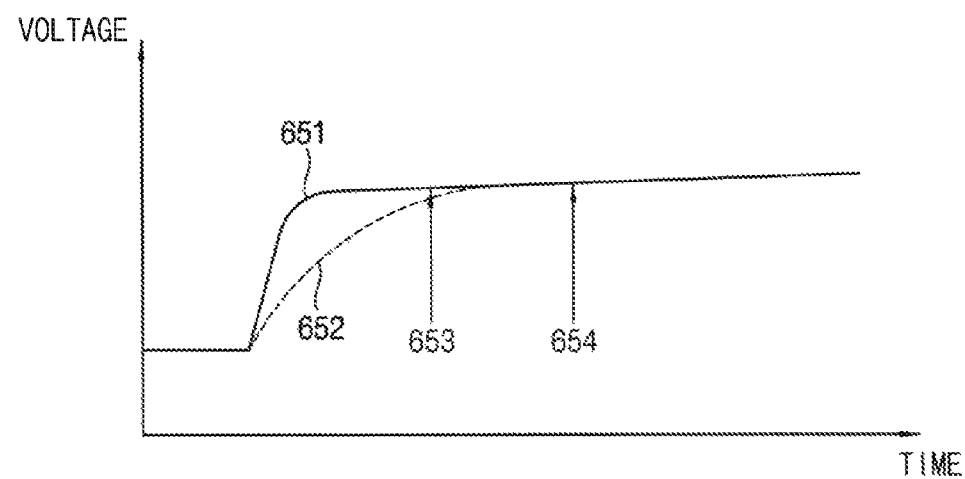

FIGS. 10 and 11 illustrate the word-line voltages or the bit-line voltages in the single mat mode and the multi-mat mode respectively, according to exemplary embodiments.

In FIG. 10, a reference numeral 641 represents one of the word-line voltages or one of the bit-line voltages in the single mat mode and a reference numeral 642 represents one of the word-line voltages or one of the bit-line voltages in the multi-mat mode. The level of the word-line voltage or the bit-line voltage in the multi-mat mode is higher than the level of the word-line voltage or the bit-line voltage in the single mat mode after a reference numeral 643. The reference numeral 643 may indicate that sensing timing is same for the single mat mode and the multi-mat mode.

Although not illustrated, the level of the word-line voltage or the bit-line voltage in the multi-mat mode may be lower than the level of the word-line voltage or the bit-line voltage in the single mat mode.

In FIG. 11, a reference numeral 651 represents one of the word-line voltages or one of the bit-line voltages in the single mat mode and a reference numeral 652 represents one of the word-line voltages or one of the bit-line voltages in the multi-mat mode. Application time interval of the word-line voltage or the bit-line voltage in the multi-mat mode may be longer than the application time interval of the word-line voltage or the bit-line voltage in the single mat mode. In this case, the applied voltage (word-line voltage or bit-line voltage) is the same in the single mat mode and the multi-mat mode. A reference numeral 653 may indicate that sensing time for the single mat mode and a reference numeral 654 for the multi-mat mode. The reference numerals 653 and 654 indicate that sensing timings are different for the single mat mode and the multi-mat mode. Although not illustrated, the application time interval of the word-line voltage or the bit-line voltage in the multi-mat mode may be shorter than the application time interval of the word-line voltage or the bit-line voltage in the single mat mode.

Although a voltage level of the word-line voltage may be different from a voltage level of the bit-line voltage, a difference between the voltage levels of the word-line voltage and the bit-line voltage is not shown in FIGS. 10 and 11 for convenience in explanation.

Figure 12:
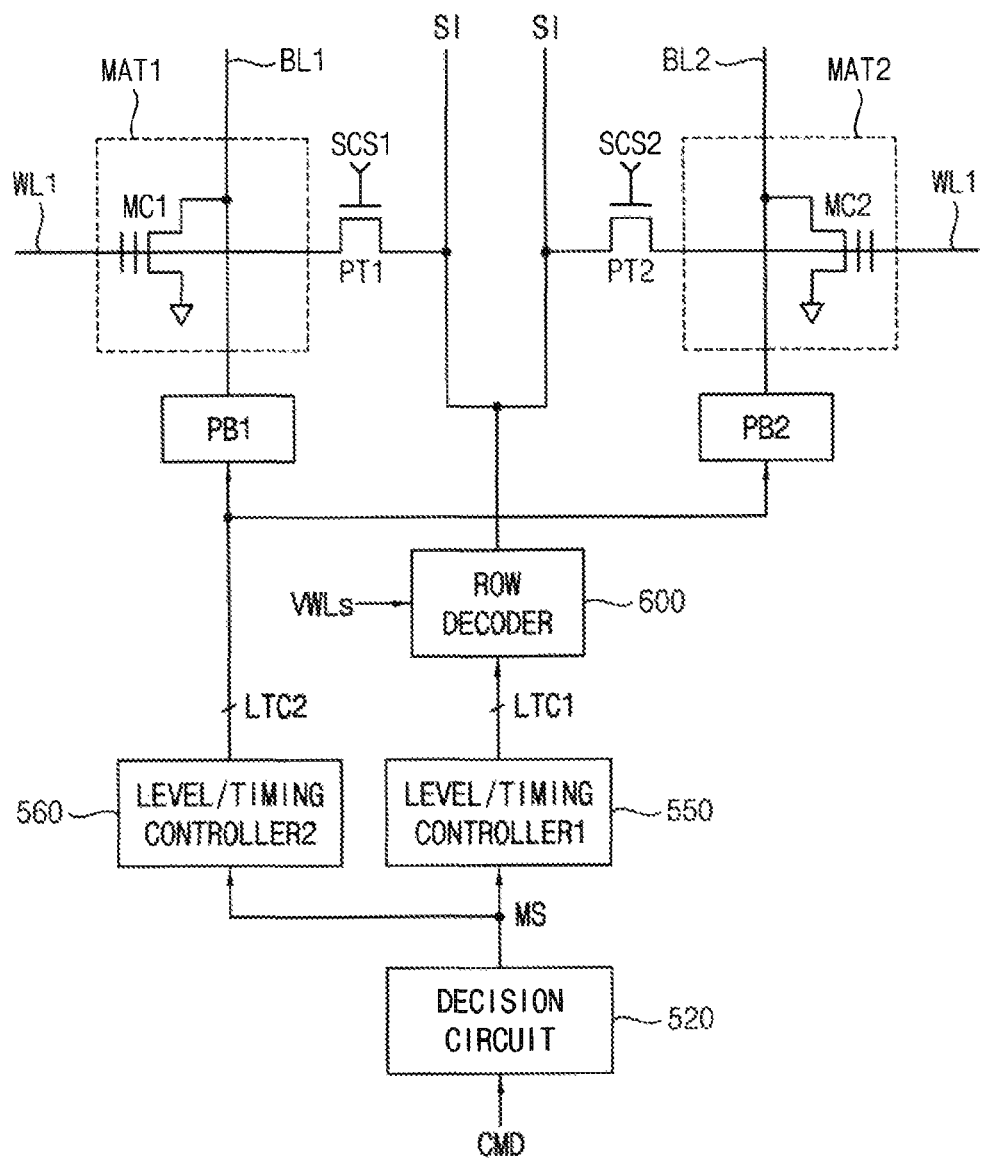
FIG. 12 illustrates the nonvolatile memory device of FIG. 3 according to exemplary embodiments.

FIG. 12 illustrates the nonvolatile memory device of FIG. 3 according to exemplary embodiments.

In FIG. 12, the first mat MAT1 of the memory cell array 100 includes a first memory cell MC1 coupled to a word-line WL1 and a bit-line BL1 and the second mat MAT2 of the memory cell array 100 includes a second memory cell MC2 coupled to the word-line WL1 and a bit-line BL2. The first memory cell MC1 is coupled to a selection line S1 through a pass transistor PT1 receiving the first switching control signal SCS1 and the second memory cell MC2 is coupled to the selection line S1 through a pass transistor PT2 receiving the second switching control signal SCS2.

The bit-line BL1 is coupled to a page buffer PB1, the bit-line BL2 is coupled to a page buffer PB2 and the second level/timing controller 560 generates the second control signal LTC2 and controls the page buffers PB1 and PB2 in response to the second control signal LTC2.

In example embodiments, a bit-line voltage generator (not shown) may generate variable bit-line voltages in response to the second control signal LTC2. For example, the bit-line voltage generator (not shown) may generate a selected bit-line voltage by selecting one of different voltages in response to the second control signal LTC2. The bit-line voltage generator (not shown) may be connected to the page buffers PB1 and PB2 and may apply the bit-line voltages to the page buffers PB1 and PB2. The page buffers PB1 and PB2 may apply bit-line voltages to the bit-lines BL1 and BL2.

In example embodiments, the bit-line voltage generator (not shown) may be included in each of the page buffers PB1 and PB2, or disposed separately from the page buffers PB1 and PB2.

In example embodiments, each of the page buffers PB1 and PB2 may apply a bit-line voltage to the selected bit-line during a selected time interval from among a plurality of different time intervals in response to the mode signal MS and the second control signal LTC2

In example embodiments, each of the first mat MAT1 and the second mat MAT2 may have an associated page buffer for applying bit-line voltages to the bit-lines. Thus, each of the first mat MAT1 and the second mat MAT2 can be operated separately from each other or simultaneously together based on the mode signal MS and the second control signal LTC2.

Figure 13:
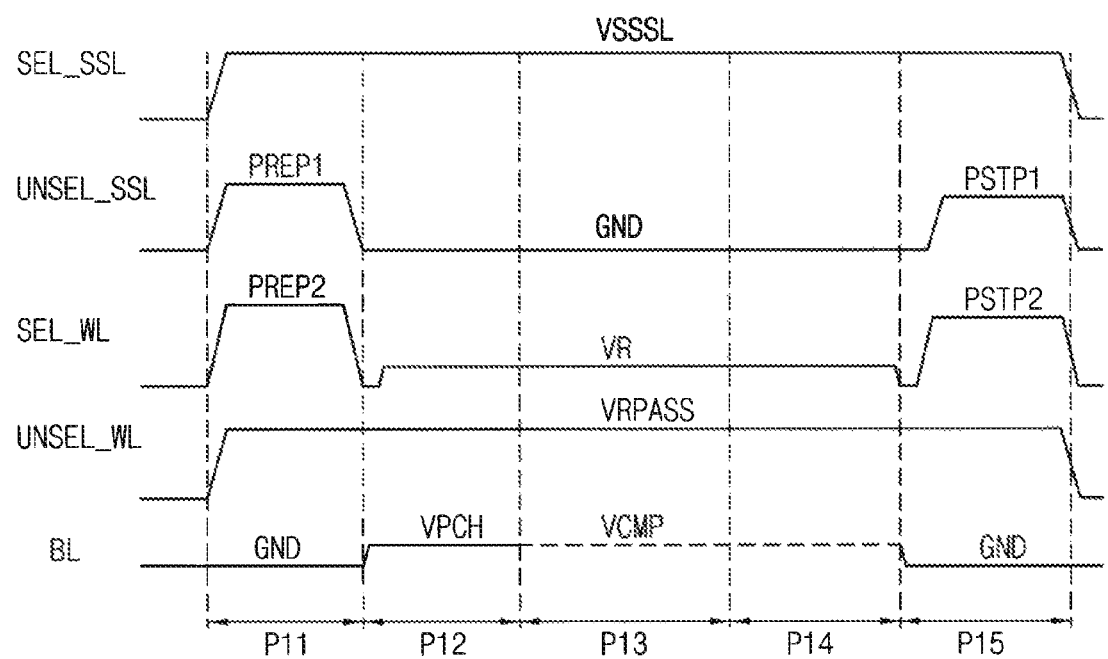
FIG. 13 is a timing diagram illustrating the word-line voltages and the bit-line voltages applied to the first and second mats in the single mat mode and the multi-mat mode in FIG. 6 when a read operation is performed on the nonvolatile memory device of FIG. 3, according to exemplary embodiments.

FIG. 13 is a timing diagram illustrating the word-line voltages and the bit-line voltages applied to the first and second mats in the single mat mode and the multi-mat mode in FIG. 6 when a read operation is performed on the nonvolatile memory device of FIG. 3, according to exemplary embodiments.

Referring to FIGS. 3 through 13, when the read operation is performed on the nonvolatile memory device 30, a string selection voltage VSSSL is applied to a selected string selection line SEL_SSL during first through fifth intervals P11~P15, a first pre-pulse PREP1 is applied to an unselected string selection line UNSEL_SSL during the first interval P11, the unselected string selection line UNSEL_SSL is discharged with a ground voltage during the second through fourth intervals P12~P14 and a first post pulse PSTP1 is applied to the unselected string selection line UNSEL_SSL during the fifth interval P15.

In addition, a second pre-pulse PREP2 is applied to a selected word-line SEL_WL during the first interval P11, the read voltage VR is applied to the selected word-line SEL_WL during the second through fourth intervals P12~P14 and a second post pulse PSTP2 is applied to the selected word-line SEL_WL during the fifth interval P15. A read pass voltage VRPASS is applied to an unselected word-line UNSEL_WL during the first through fifth intervals P11~P15.

The bit-line BL is set-up during the first interval P11, is precharged by receiving a precharge voltage VPCH during the second interval P12, is developed during the third interval P13, is clamped with a voltage VCMP during the third and fourth intervals P13 and P14, and is discharged with the ground voltage during the fifth interval P15.

Figure 14:
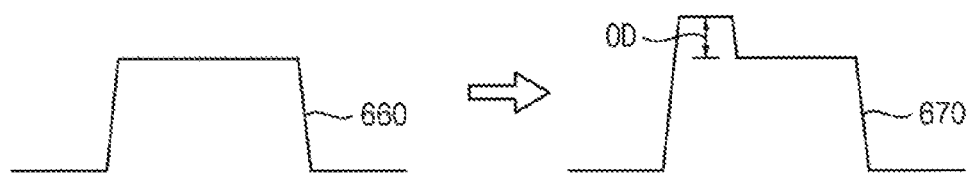
FIG. 14 illustrates that one of the word-line voltages or one of the bit-line voltages in the single mat mode is over-driven in the multi-mat mode, according to exemplary embodiments.

FIG. 14 illustrates that one of the word-line voltages or one of the bit-line voltages in the single mat mode is over-driven in the multi-mat mode, according to exemplary embodiments.

In FIG. 14, a reference numeral 660 represents one of the word-line voltages or one of the bit-line voltages in the single mat mode and a reference numeral 670 represents one of the word-line voltages or one of the bit-line voltages in the multi-mat mode. The voltage level is over-driven by an amount OD and then reduced to the voltage level of the single mat mode in the multi-mat mode. Over-driving the voltage levels may mean that the voltage levels are different in the single mat mode and the multi-mat mode and over-driving the voltage levels may be applicable to overall program operation in addition to the read operation.

FIG. 15 is a table illustrating setting values of levels and application time interval of the word-line voltages and the bit-line voltages applied to the first second mats in FIGS. 13 and 14 when a read operation is performed on the nonvolatile memory device of FIG. 3, according to exemplary embodiments.

Referring to FIG. 15, when the read operation is performed on the nonvolatile memory device 30, it is noted that the setting values of levels and application time interval of the word-line voltages and the bit-line voltages in the single mat mode are smaller than the setting values of levels and application time interval of the word-line voltages and the bit-line voltages in the multi-mat mode.

The setting values in FIG. 15 may be stored as the command set CMDSET in the first level/timing controller 550 and the second level/timing controller 560 in FIG. 7. In addition, the setting values in FIG. 15 may be stored based on information which is predetermined in the nonvolatile memory device 30. The first level/timing controller 550 and the second level/timing controller 560 may control the row decoder 600 and the page buffer circuit 410 respectively by referring the setting values such that at least one of the voltage levels and the application time interval are different in the single mat mode and the multi-mat mode.

For example, a level of the second pre-pulse PREP2 applied to a selected word-line SEL_WL may be 5.3V in the single mat mode and may be 5.5V in the multi-mat mode, during a specific period of time (e.g., the first interval P11). As another example, the second pre-pulse PREP2 having a particular voltage (e.g., 5.3V) may be applied during Bus in the single mat mode and may be applied during 8.2 us in the multi-mat mode.

Although not illustrated, in exemplary embodiments, that the setting values of levels and application time interval of the word-line voltages and the bit-line voltages in the single mat mode are greater than the setting values of levels and application time interval of the word-line voltages and the bit-line voltages in the multi-mat mode.

Figure 16:
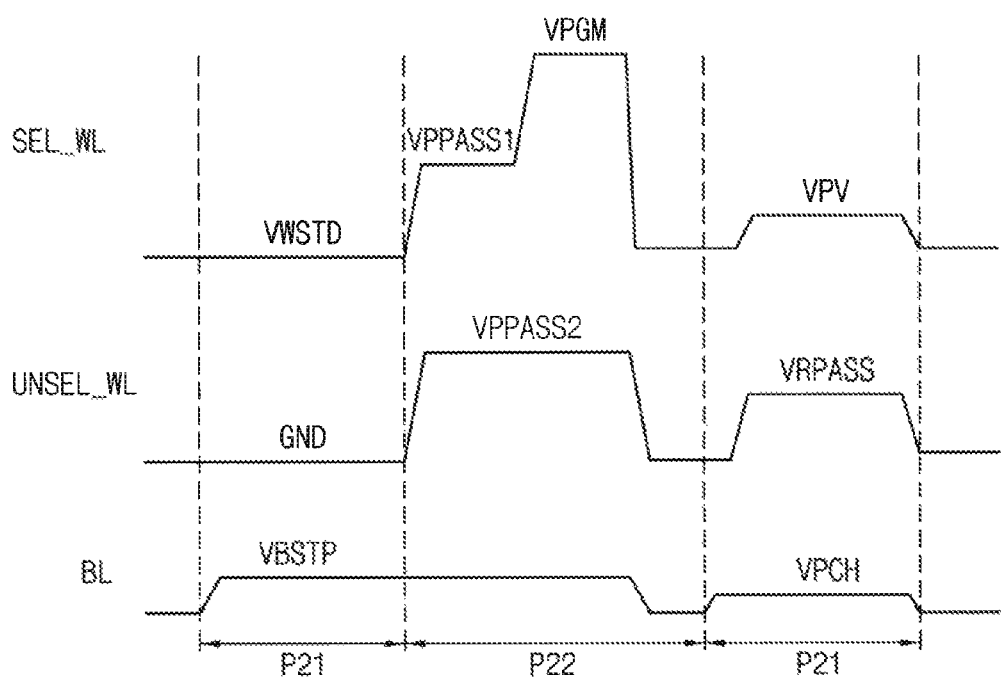
FIG. 16 is a timing diagram illustrating the word-line voltages and the bit-line voltages applied to the first and second mats in the single mat mode and the multi-mat mode in FIG. 6 when a program operation is performed on the nonvolatile memory device of FIG. 3, according to exemplary embodiments.

FIG. 16 is a timing diagram illustrating the word-line voltages and the bit-line voltages applied to the first and second mats in the single mat mode and the multi-mat mode in FIG. 6 when a program operation is performed on the nonvolatile memory device of FIG. 3, according to exemplary embodiments.

Referring to FIGS. 3 through 12 and 16, when the program operation is performed on the nonvolatile memory device 30, a word-line set-up voltage VWSTP is applied to a selected word-line SEL_WL during a first interval P21, a program pass voltage VPPASS1 and a program voltage VPGM are sequentially applied to the selected word-line SEL_WL during a second interval P22 and a program verification voltage VPV is applied to the selected word-line SEL_WL during a third interval P23 to verify whether the program operation is properly performed.

A ground voltage GND is applied to an unselected word-line UNSEL_WL during the first interval P21 to discharge the unselected word-line UNSEL_WL, a program pass voltage VPPASS2 is applied to the unselected word-line UNSEL_WL during the second interval P22 and a read pass voltage VRPASS is applied to the unselected word-line UNSEL_WL during the second interval P23.

The bit-line BL is set-up by receiving the bit-line set-up voltage VBSTP during the first and intervals P21 and P22, is precharged by receiving a precharge voltage VPCH during the third interval P23, and is discharged after the third interval P23.

FIG. 17 is a table illustrating setting values of levels and application time interval of the word-line voltages and the bit-line voltages applied to the first and second mats in FIG. 16 when the program operation is performed on the nonvolatile memory device of FIG. 3, according to exemplary embodiments.

Referring to FIG. 17, when the program operation is performed on the nonvolatile memory device 30, it is noted that the setting values of levels and application time interval of the word-line voltages and the bit-line voltages in the single mat mode are smaller than the setting values of levels and application time interval of the word-line voltages and the bit-line voltages in the multi-mat mode.

The setting values in FIG. 17 may be stored as the command set CMDSET in the first level/timing controller 550 and the second level/timing controller 560 in FIG. 7. The first level/timing controller 550 and the second level/timing controller 560 may control the row decoder 600 and the page buffer circuit 410 respectively by referring the setting values such that at least one of the voltage levels and the application time interval are different in the single mat mode and the multi-mat mode.

FIG. 15 illustrates the setting values of levels and application time interval of the word-line voltages and the bit-line voltages in the single mat mode and the multi-mat mode during the read operation on the nonvolatile memory device 30 and FIG. 17 illustrates the setting values of levels and application time interval of the word-line voltages and the bit-line voltages in the single mat mode and the multi-mat mode during the program operation on the nonvolatile memory device 30.

Although not illustrated, levels and application time interval of the erase voltage applied to the well of the memory block in the erase operation and levels and application time interval of the erase verification voltage in the erase verification operation may be different in the single mat mode and the multi-mat mode. Setting values of the erase voltage and the erase verification voltage may be stored as the command set CMDSET in the first level/timing controller 550 and the second level/timing controller 560.

The operation on the nonvolatile memory device 30 may include one of the program operation, the read operation and the erase operation.

Figure 18:
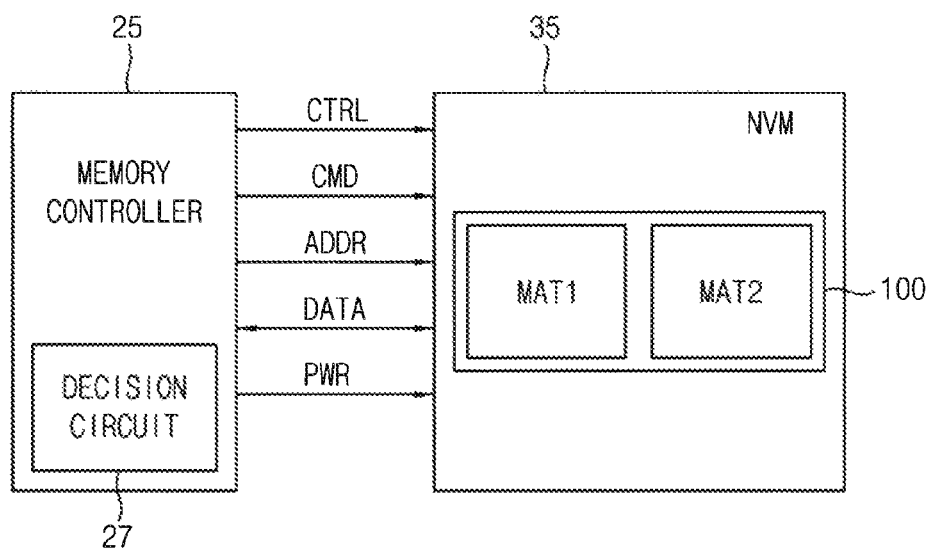
FIG. 18 is a block diagram illustrating a memory system according to exemplary embodiments.

FIG. 18 is a block diagram illustrating a memory system according to exemplary embodiments.

Referring to FIG. 18, a memory system (or, a nonvolatile memory system) 15 may include a memory controller 25 and at least one nonvolatile memory device 35.

The memory system 15 of FIG. 18 differs from the memory system of FIG. 1. The nonvolatile memory device 30 includes the decision circuit 520 in FIG. 1 while the memory controller 25 includes a decision circuit 27.

When the memory controller 25 includes the decision circuit 27, a control circuit such as the control circuit 500 of FIG. 7, which may be included in the nonvolatile memory device 35, may include components of the control circuit 500 except the decision circuit 520.

The decision circuit 27 determines a number of mats of the mats MAT1 and MAT2, which operate simultaneously, and transmits the command CMD or the control signal CTRL including a mode signal indicating the number of mats which operate simultaneously to the nonvolatile memory device 35.

For example, when the decision circuit 27 determines a single mat mode or a multi-mat mode of the mats MAT1 and MAT2, the decision circuit 27 may transmit, to the nonvolatile memory device 35, levels and an application time interval of the word-line voltages or levels and an application time interval of the bit-line voltages applied to the bit-lines as a command set before the decision circuit transmit 25, to the nonvolatile memory device 35, a command sequence designating one of the single mat mode and the multi-mat mode.

For example, when the decision circuit 27 determines the single mat mode or the multi-mat mode of the mats MAT1 and MAT2, the decision circuit 27 may transmit, to the nonvolatile memory device 35, the levels and an application time interval of the word-line voltages or the levels and an application time interval of voltages of the bit-lines as a command set with the mode signal designating one of the single mat mode and the multi-mat mode. The command set of the setting values may be included in the command sequence transmitted to the nonvolatile memory device 35.

Figure 19:
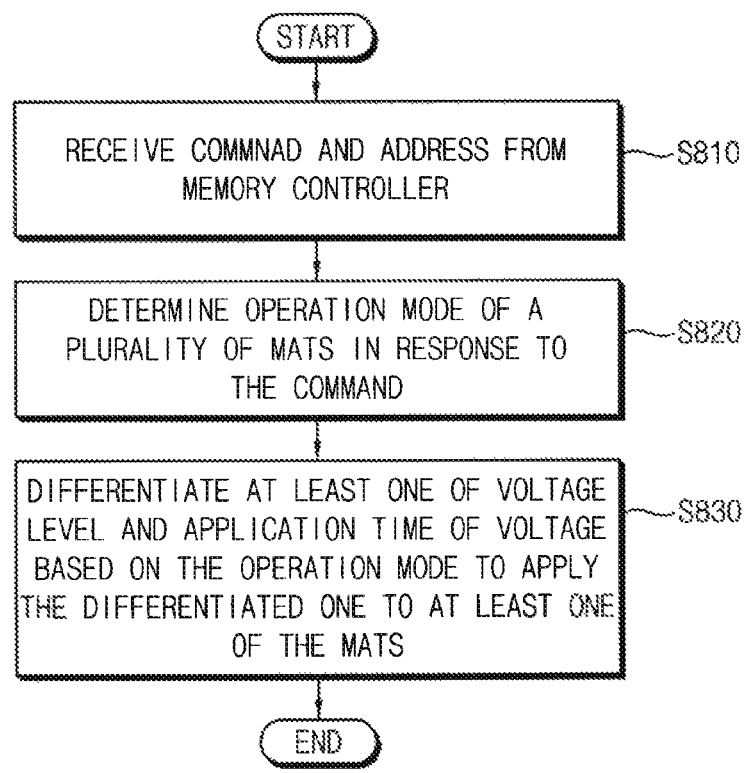
FIG. 19 is a flow chart illustrating a method of nonvolatile memory device according to exemplary embodiments.

FIG. 19 is a flow chart illustrating a method of nonvolatile memory device according to exemplary embodiments.

Referring to FIG. 1 through 19, in a method of operating a nonvolatile memory device 30 including a memory cell array including a plurality of mats corresponding to different bit-lines, the nonvolatile memory device 30 receives a command CMD and an address ADDR from a memory controller 20 (S810).

A decision circuit 520 of a control circuit 500 determines an operation mode to one of a single mat mode and a multi-mat mode in response to the command CMD (S820).

The decision circuit 520 provides first and second level/timing controllers 550 and 560 with a mode signal MS designating one of the single mat mode and the multi-mat mode to control the row decoder 600 and the page buffer circuit 410 such that at least one of levels of the word-line voltages or the bit-line voltages and an application time interval of the word-line voltages or the bit-line voltages are different in the single mat mode and the multi-mat mode (S830).

In a nonvolatile memory device, a memory system and a method of a nonvolatile memory device according to exemplary embodiments, levels or application time intervals of the voltages applied to the memory cell array are differentiated in the single mat mode and the multi-mat mode, and performance in both the single mat mode and the multi-mat mode may be enhanced.

Figure 20:
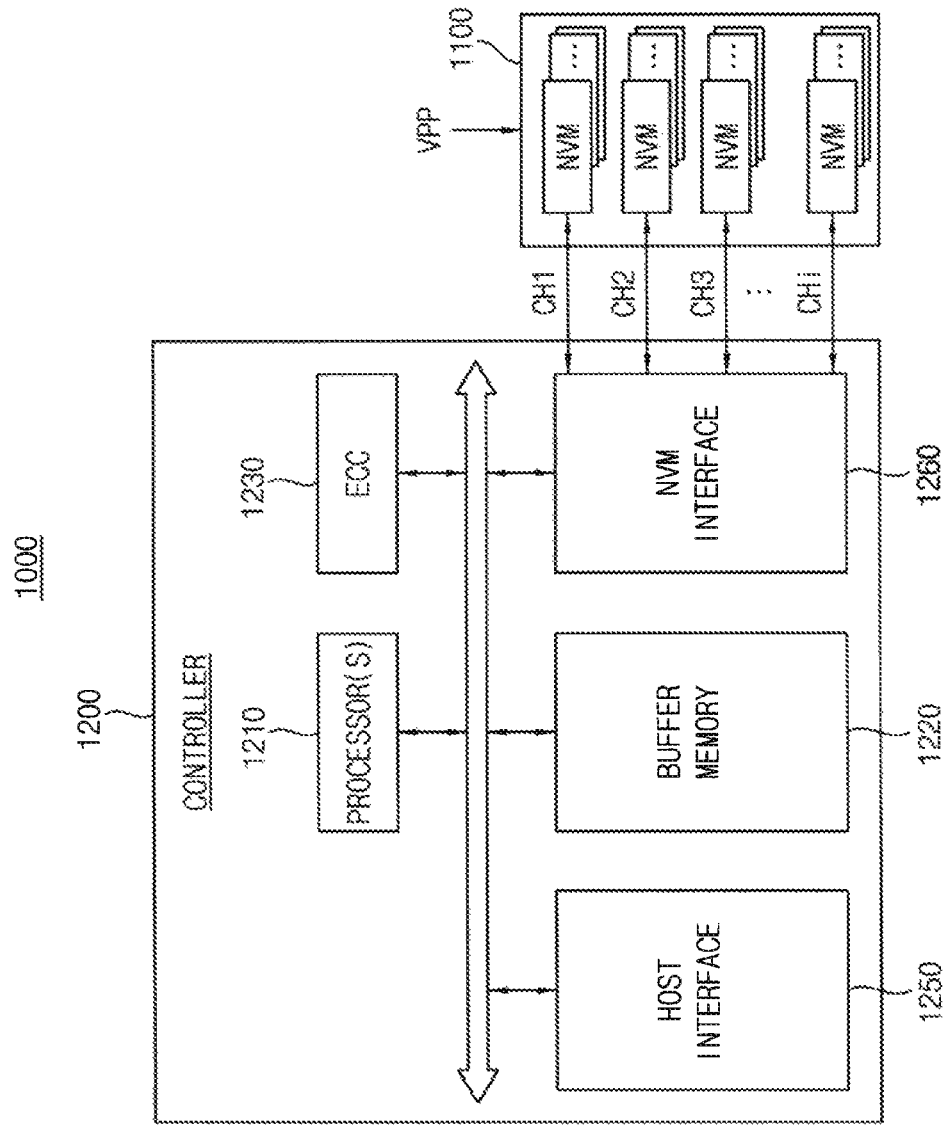
FIG. 20 is a block diagram illustrating a solid state disk or solid state drive (SSD) according to exemplary embodiments.

FIG. 20 is a block diagram illustrating a solid state disk or solid state drive (SSD) according to exemplary embodiments.

Referring to FIG. 20, an SSD 1000 includes multiple nonvolatile memory devices 1100 and an SSD controller 1200.

The nonvolatile memory devices 1100 may be optionally supplied with an external high voltage VPP. Each of the nonvolatile memory devices 1100 may employ the nonvolatile memory device 30 of FIG. 3. Each of the nonvolatile memory devices 1100 may differentiate levels or application time intervals of the voltages applied to the word-lines and bit-lines of the memory cell array in the single mat mode and in the multi-mat mode The SSD controller 1200 is connected to the nonvolatile memory devices 1100 through multiple channels CH1 to CHi. The SSD controller 1200 includes one or more processors 1210, a buffer memory 1220, an ECC block 1230, a host interface 1250, and a nonvolatile memory interface 1260. The buffer memory 1220 stores data used to drive the SSD controller 1200.

The buffer memory 1220 includes multiple memory lines each storing data or a command.

The ECC block 1230 calculates error correction code values of data to be programmed at a writing operation and corrects an error of read data using an error correction code value at a read operation.

A nonvolatile memory device or a storage device according to an embodiment of the inventive concept may be packaged using various package types or package configurations The present disclosure may be applied to various electronic devices including a nonvolatile memory device. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A nonvolatile memory device comprising:
a memory cell array including a plurality of planes, each of the plurality of planes including a plurality of cell strings, wherein:
a first cell string of a first plane of the plurality of planes is connected to a plurality of first word-lines and a first bit-line,
a second cell string of a second plane of the plurality of planes is connected to a plurality of second word-lines and a second bit-line, and
the first and second cell strings are perpendicular to a substrate respectively; and
a row decoder connected to the plurality of first and second word-lines and configured to apply corresponding word-line voltages to the plurality of first and second word-lines,
wherein the row decoder is configured to apply a first pre-pulse to a selected word-line among the plurality of first and second word-lines for a first period of time when only one of the first and second planes operates for reading data from an operating plane of the first and second planes and to apply a second pre-pulse to the selected word-line for a second period of time when both of the first and second planes simultaneously operate for reading data from the operating planes, and the second period of time is different from the first period of time.

2. The nonvolatile memory device of claim 1, wherein the second period of time is longer than the first period of time.

3. The nonvolatile memory device of claim 2, wherein each of the first and second cell strings includes at least one ground selection transistor, a plurality of memory cells, and at least one string selection transistor coupled in series.

4. The nonvolatile memory device of claim 3, wherein the row decoder is further configured to apply a first read voltage after applying the first pre-pulse to the selected word-line for a third period of time when only one of the first and second planes operates for reading data from the operating plane, and to apply a second read voltage after applying the second pre-pulse to the selected word-line for a fourth period of time when both of the first and second planes simultaneously operate for reading data from both of the first and second planes, and the third period of time is different from the fourth period of time.

5. The nonvolatile memory device of claim 4, wherein the fourth period of time is longer than the third period of time.

6. The nonvolatile memory device of claim 5, wherein the fourth period of time is longer than the second period of time, and the third period of time is longer than the first period of time.

7. The nonvolatile memory device of claim 6, wherein a first time difference between the fourth period of time and the third period of time is greater than a second time difference between the second period of time and the first period of time.

8. The nonvolatile memory device of claim 7, wherein a voltage level of the first pre-pulse is higher than a voltage level of the first read voltage, and a voltage level of the second pre-pulse is higher than a voltage level of the second read voltage.

9. The nonvolatile memory device of claim 8, wherein the row decoder is further configured to apply a first selection voltage to the string selection transistor of the first or second cell string for a fifth period of time when only one of the first and second planes operates for reading data from the operating plane, and to apply a second selection voltage to the string selection transistors of the first and second cell strings for a sixth period of time when both of the first and second planes simultaneously operate for reading data from both of the first and second planes, and the fifth period of time is different from the sixth period of time.

10. The nonvolatile memory device of claim 9, wherein the sixth period of time is longer than the fifth period of time.

11. The nonvolatile memory device of claim 10, wherein the row decoder is further configured to apply a third pre-pulse to an unselected word-line of the plurality of first and second word-lines for a seventh period of time when only one of the first and second planes operates for reading data from the operating plane and to apply a fourth pre-pulse to the unselected word-line for an eighth period of time when both of the first and second planes simultaneously operate for reading data from the operating planes, and the eighth period of time is different from the seventh period of time.

12. The nonvolatile memory device of claim 11, wherein the eighth period of time is longer than the seventh period of time.

13. The nonvolatile memory device of claim 12, wherein the eighth period of time is longer than the second period of time.

14. The nonvolatile memory device of claim 1, wherein the row decoder is further configured to apply a first program pass voltage to a second selected word-line of the plurality of first and second word-lines for a ninth period of time when only one of the first and second planes operates for programming data in the operating plane and to apply a second program pass voltage to the second selected word-line for a tenth period of time when both of the first and second planes simultaneously operate for programming data in the operating planes, and the tenth period of time is different from the ninth period of time.

15. The nonvolatile memory device of claim 14, wherein the tenth period of time is longer than the ninth period of time.

16. The nonvolatile memory device of claim 15, wherein the row decoder is further configured to apply a first program voltage to the second selected word-line of the plurality of first and second word-lines after applying the first program pass voltage for a eleventh period of time when only one of the first and second planes operates for programming data in the operating plane and to apply a second program voltage to the second selected word-line after applying the second program pass voltage for a twelfth period of time when both of the first and second planes simultaneously operate for programming data in the operating planes, and the twelfth period of time is different from the eleventh period of time.

17. The nonvolatile memory device of claim 16, wherein the twelfth period of time is longer than the eleventh period of time.

18. The nonvolatile memory device of claim 17, wherein the row decoder is further configured to apply a first word-line set up voltage to the second selected word-line of the plurality of first and second word-lines before applying the first program pass voltage for a thirteenth period of time when only one of the first and second planes operates for programming data in the operating plane and to apply a second word-line set up voltage to the second selected word-line before applying the second program pass voltage for a fourteenth period of time when both of the first and second planes simultaneously operate for programming data in the operating planes, and the fourteenth period of time is different from the thirteenth period of time.

19. The nonvolatile memory device of claim 18, wherein the fourteenth period of time is longer than the thirteenth period of time.

20. The nonvolatile memory device of claim 19, wherein the row decoder is further configured to apply a third program pass voltage to a second unselected word-line of the plurality of first and second word-lines for a fifteenth period of time when only one of the first and second planes operates for programming data in the operating plane and to apply a fourth program pass voltage to the second unselected word-line for a sixteenth period of time when both of the first and second planes simultaneously operate for programming data in the operating planes, and the sixteenth period of time is different from the fifteenth period of time.

21. The nonvolatile memory device of claim 20, wherein the sixteenth period of time is longer than the fifteenth period of time.

22. The nonvolatile memory device of claim 1, wherein the nonvolatile memory device further comprises a page buffer circuit coupled to the memory cell array through the first and second bit-lines and configured to provide bit-line voltages to the first and second bit-lines.

23. The nonvolatile memory device of claim 22, wherein the row decoder comprises:
    a decoder configured to generate a first plane selection signal to select the first plane and a second plane selection signal to select the second plane in response to an address and a mode signal;
    a first switch circuit configured to electrically connect the first plane with a plurality of selection lines in response to the first plane selection signal; and
    a second switch circuit configured to electrically connect the second plane with the plurality of selection lines in response to the second plane selection signal.

24. The nonvolatile memory device of claim 23, wherein the nonvolatile memory device further comprises a voltage generator configured to provide the plurality of selection lines with different voltages in response to a control signal.

25. The nonvolatile memory device of claim 24, wherein the control signal is generated from a command latch enable signal, an address latch enable signal, a chip enable signal, a read enable signal, and a write enable signal.

* * * * *